(12) United States Patent
Tran et al.

(10) Patent No.: US 11,372,056 B2
(45) Date of Patent: Jun. 28, 2022

(54) CIRCUIT FOR DETECTING PIN-TO-PIN LEAKS OF AN INTEGRATED CIRCUIT PACKAGE

(71) Applicant: SanDisk Technologies LLC, Addison, TX (US)

(72) Inventors: Dat Tran, San Jose, CA (US); Loc Tu, San Jose, CA (US); Kirubakaran Periyannan, Santa Clara, CA (US); Nyi Nyi Thein, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 137 days.

(21) Appl. No.: 16/883,718

(22) Filed: May 26, 2020

(65) Prior Publication Data

US 2021/0373085 A1    Dec. 2, 2021

(51) Int. Cl.
*G01R 31/52* (2020.01)
*G01R 31/26* (2020.01)
*G01R 31/64* (2020.01)

(52) U.S. Cl.
CPC ......... *G01R 31/52* (2020.01); *G01R 31/2632* (2013.01); *G01R 31/64* (2020.01)

(58) Field of Classification Search
CPC ........ G01R 31/50; G01R 31/52; G01R 31/55; G01R 31/58; G01R 31/66–71; G01R 31/64

See application file for complete search history.

(56) References Cited

U.S. PATENT DOCUMENTS

| 4,293,813 A | * | 10/1981 | Groenenboom | ....... | G01R 19/20 324/117 R |
| 5,428,621 A | * | 6/1995 | Mehrotra | ............... | G11C 29/02 714/711 |

(Continued)

FOREIGN PATENT DOCUMENTS

| DE | 19542989 A1 * | 5/1996 | ............. G01R 31/52 |
| DE | 102012212535 A1 * | 1/2014 | ........... G01R 31/086 |

(Continued)

OTHER PUBLICATIONS

Muhtaroglu, et al., "I/O Self-Leakage Test," ITC International Test Conference, Paper 32.3, Nov. 2004, 5 pages.

(Continued)

*Primary Examiner* — Patrick Assouad
*Assistant Examiner* — Demetrius R Pretlow
(74) *Attorney, Agent, or Firm* — Vierra Magen Marcus LLP

(57) ABSTRACT

Techniques and apparatuses are provided for detecting a short circuit between pins of an integrated circuit package. The tested pins can be adjacent or non-adjacent on the package. Various types of short circuits can be detected, including resistive, diode and capacitive short circuits. Additionally, short circuits of a single pin can be tested, including a short circuit to a power supply or to ground. The test circuit includes a current mirror, where the input path has a first path connected to a first pin and a parallel second path connected to a second pin. A comparator is connected to the output path of the current mirror. By controlling the on and off states of transistors in the first and second paths, and evaluating the voltage of the output path, the short circuits can be detected.

20 Claims, 17 Drawing Sheets

(56) References Cited

U.S. PATENT DOCUMENTS

| | | | | |
|---|---|---|---|---|
| 5,659,514 A | * | 8/1997 | Hazani | G11C 11/5621 |
| | | | | 257/E21.682 |
| 5,880,614 A | * | 3/1999 | Zinke | H03K 5/088 |
| | | | | 327/205 |
| 5,942,886 A | * | 8/1999 | Kelly | H03K 17/0822 |
| | | | | 323/312 |
| 6,307,778 B1 | * | 10/2001 | Micheloni | G11C 29/02 |
| | | | | 365/185.09 |
| 6,377,053 B1 | * | 4/2002 | Mazzucco | G01R 31/52 |
| | | | | 324/509 |
| 6,489,779 B1 | * | 12/2002 | Tucker | G11B 5/022 |
| | | | | 324/522 |
| 6,509,739 B1 | * | 1/2003 | Voogel | G01R 31/54 |
| | | | | 324/525 |
| 6,967,488 B1 | * | 11/2005 | Arigliano | G01R 31/52 |
| | | | | 324/656 |
| 7,061,263 B1 | | 6/2006 | Ong | |
| 8,140,900 B2 | | 3/2012 | Yang et al. | |
| 8,446,772 B2 | | 5/2013 | Tu et al. | |
| 8,826,086 B2 | | 9/2014 | Hook et al. | |
| 9,442,151 B2 | | 9/2016 | Tubul et al. | |
| 2002/0167849 A1 | * | 11/2002 | Ohbayashi | G11C 29/50 |
| | | | | 365/189.09 |
| 2003/0062916 A1 | * | 4/2003 | Manhaeve | G01R 31/3008 |
| | | | | 324/750.3 |
| 2003/0095431 A1 | * | 5/2003 | Khalid | G11C 7/12 |
| | | | | 365/185.03 |
| 2005/0088239 A1 | * | 4/2005 | Tai | H03F 1/523 |
| | | | | 330/298 |
| 2005/0168491 A1 | * | 8/2005 | Takahara | G09G 3/325 |
| | | | | 345/690 |
| 2005/0275414 A1 | * | 12/2005 | Arigliano | G01R 31/52 |
| | | | | 324/656 |
| 2006/0190790 A1 | * | 8/2006 | Pilling | G01R 31/2853 |
| | | | | 714/734 |
| 2008/0144243 A1 | * | 6/2008 | Mariani | G01R 31/71 |
| | | | | 361/56 |
| 2008/0316930 A1 | * | 12/2008 | Xu | G01R 31/67 |
| | | | | 370/242 |
| 2010/0201283 A1 | * | 8/2010 | Kawata | H05B 45/3725 |
| | | | | 315/287 |
| 2011/0279128 A1 | * | 11/2011 | Von Staudt | G09G 3/3216 |
| | | | | 324/538 |
| 2013/0325303 A1 | * | 12/2013 | Kiuchi | G01R 31/396 |
| | | | | 701/112 |
| 2013/0332750 A1 | * | 12/2013 | Souma | H02H 3/087 |
| | | | | 713/300 |
| 2014/0333320 A1 | * | 11/2014 | Barnetova | G01R 31/006 |
| | | | | 324/503 |
| 2016/0018453 A1 | | 1/2016 | Eon et al. | |
| 2016/0212820 A1 | * | 7/2016 | Kalkschmidt | H05B 45/50 |
| 2017/0089957 A1 | * | 3/2017 | Takada | H01L 29/7813 |
| 2017/0276715 A1 | | 9/2017 | Heinz et al. | |
| 2019/0006020 A1 | | 1/2019 | Sundaresa et al. | |
| 2019/0097533 A1 | * | 3/2019 | Kawata | G05F 3/08 |
| 2019/0242929 A1 | * | 8/2019 | Yoshino | H03F 3/2173 |
| 2019/0260290 A1 | * | 8/2019 | Maejima | G01R 31/52 |
| 2020/0027379 A1 | * | 1/2020 | Kim | G01R 1/30 |

FOREIGN PATENT DOCUMENTS

| | | | | |
|---|---|---|---|---|
| EP | 0486114 A2 | * | 5/1992 | G01R 31/50 |
| EP | 1083575 A1 | | 3/2001 | |
| JP | 2000010643 A | * | 1/2000 | |
| JP | 2001256119 A | * | 9/2001 | |
| JP | 2007220289 A | * | 8/2007 | |
| JP | 2010287297 A | * | 12/2010 | |
| KR | 20110039820 A | * | 4/2011 | |

OTHER PUBLICATIONS

International Search Report & The Written Opinion of the International Searching Authority dated Jun. 3, 2021, International Application No. PCT/US2021/017997.

* cited by examiner

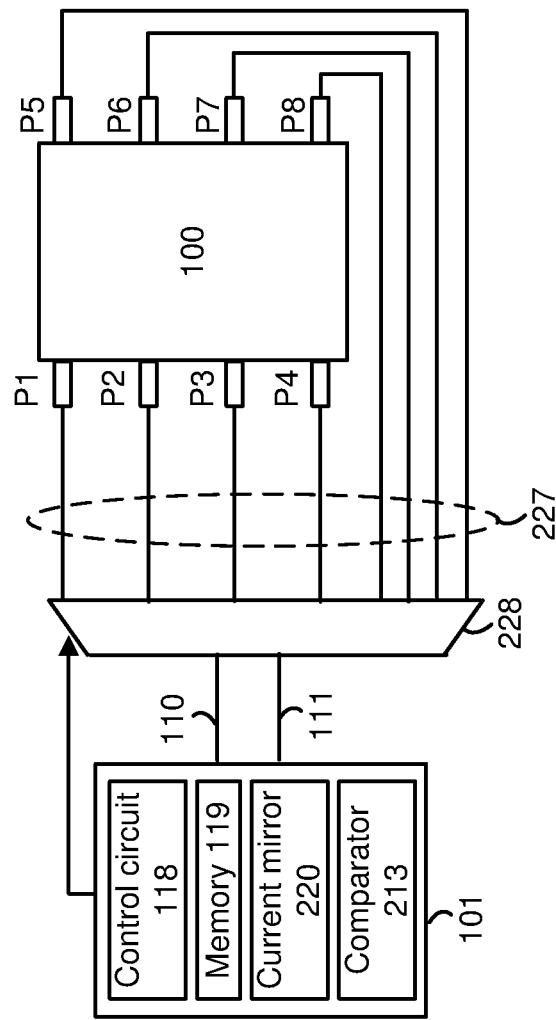
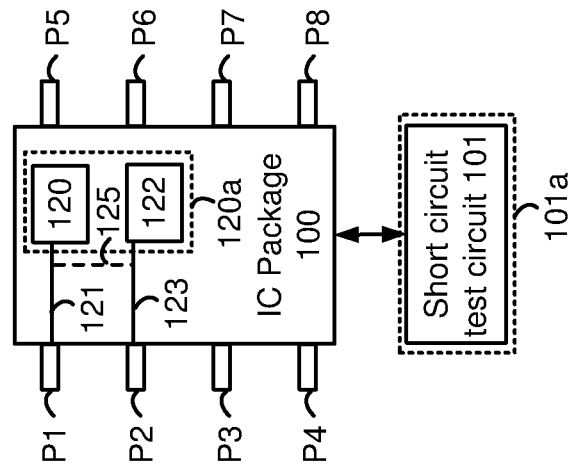

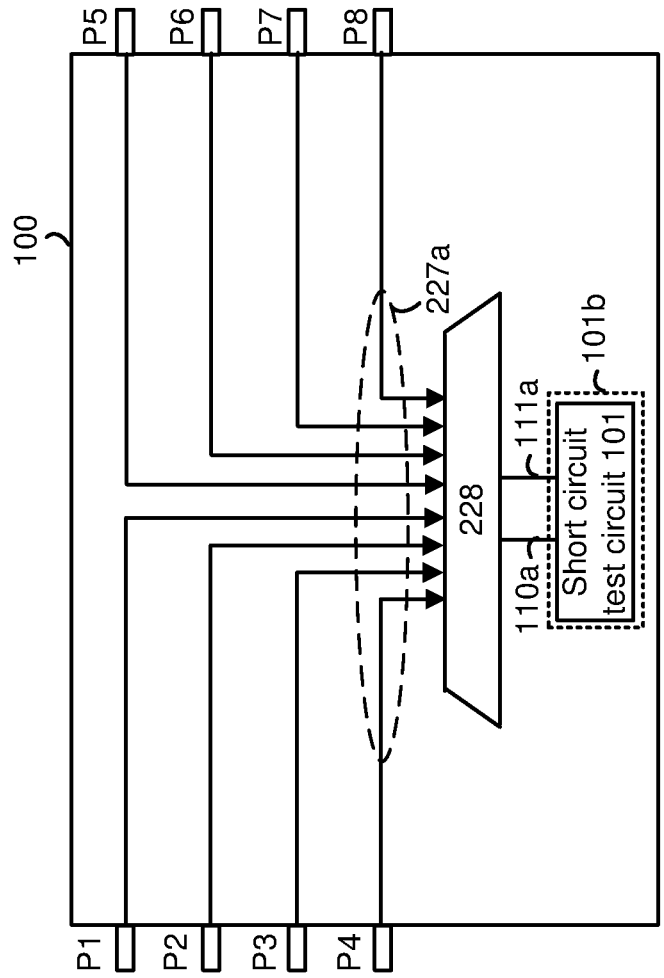

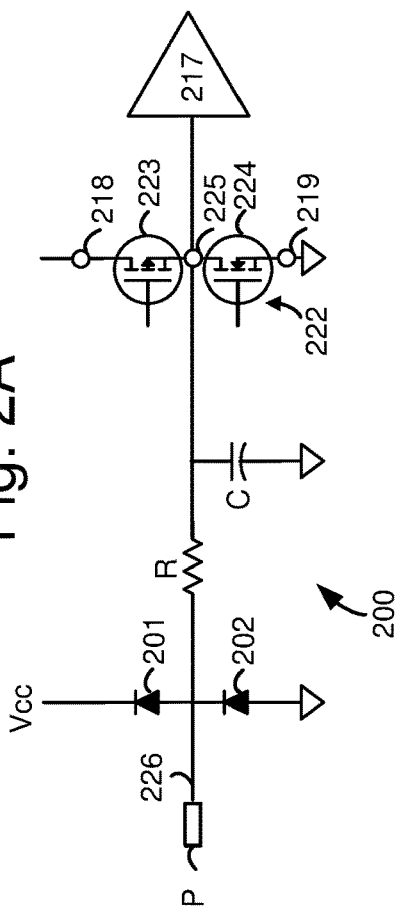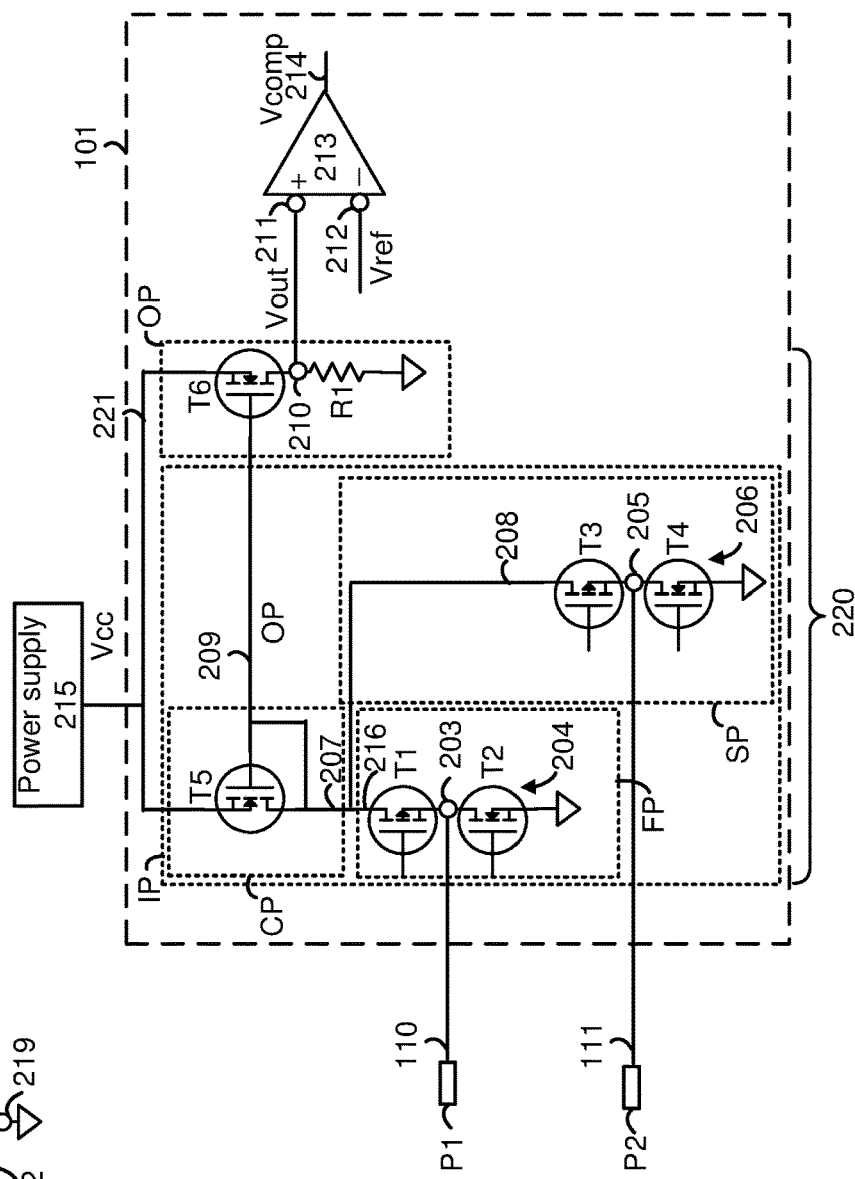

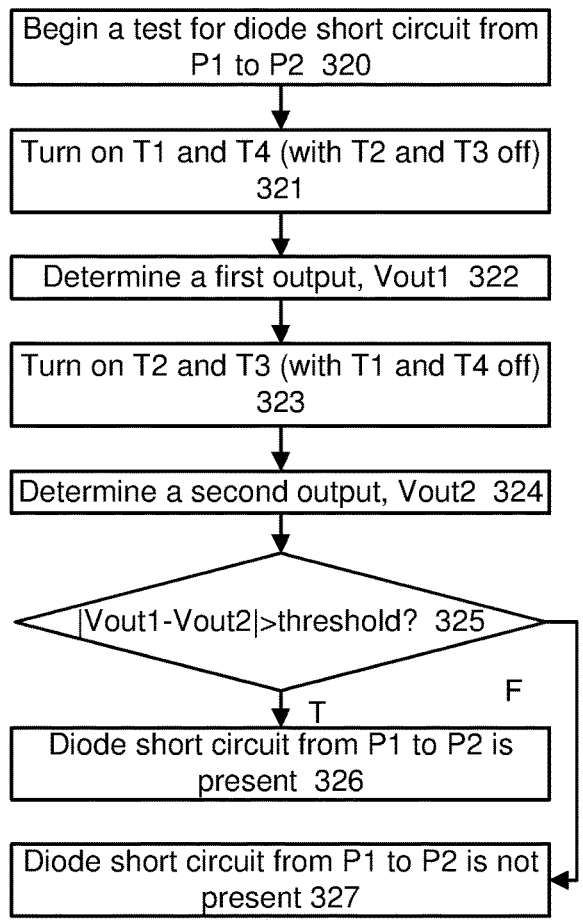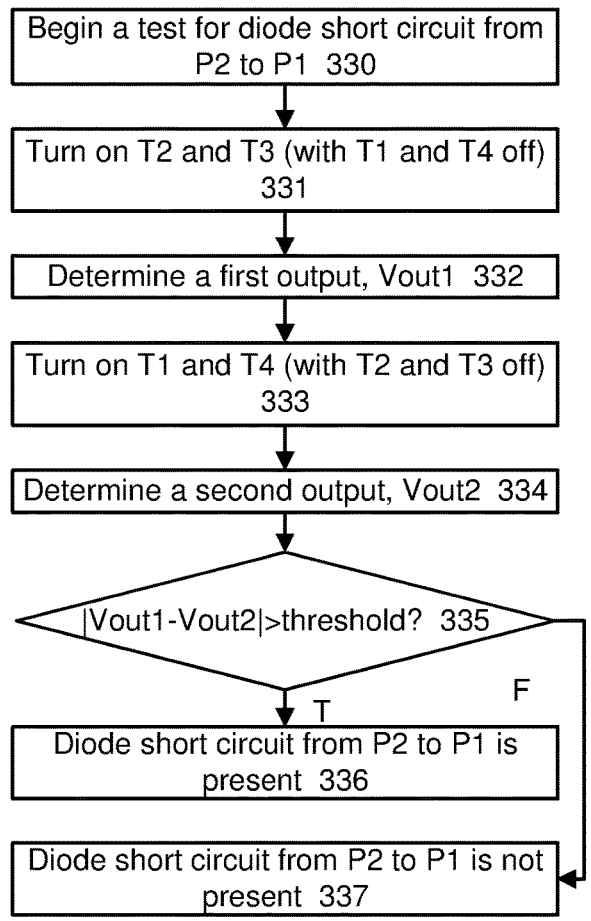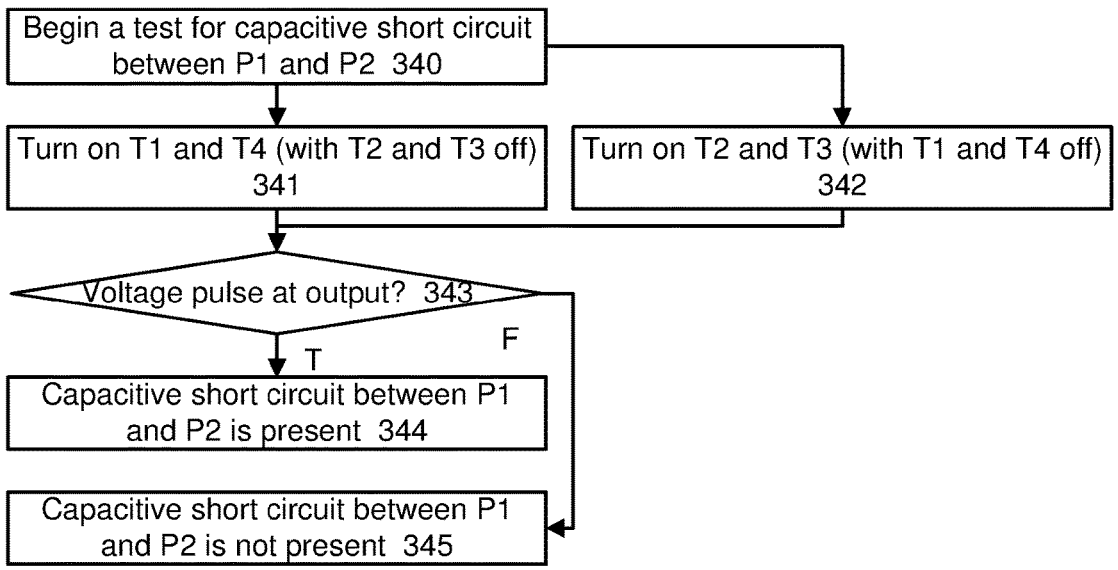

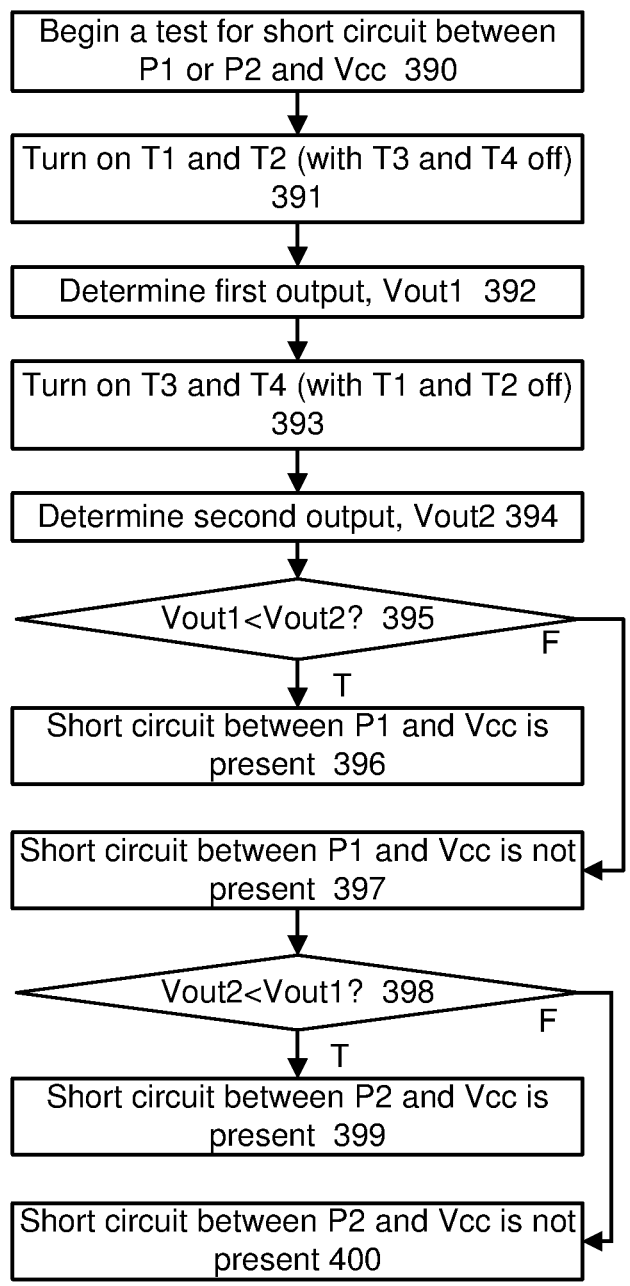

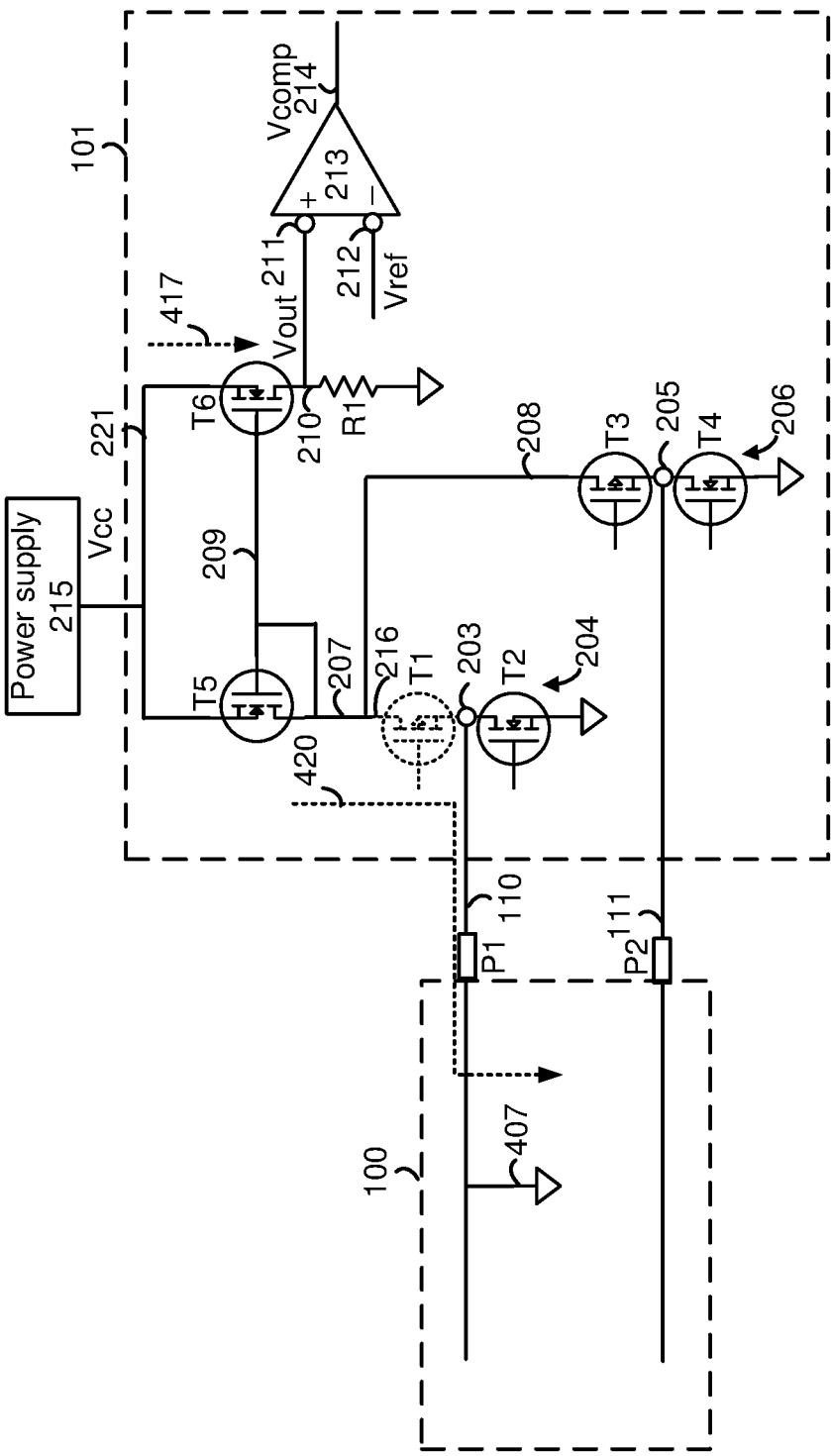

CIRCUIT FOR DETECTING PIN-TO-PIN LEAKS OF AN INTEGRATED CIRCUIT PACKAGE

BACKGROUND

The present technology relates to testing of integrated circuit (IC) packages.

An IC chip comprises electronic components such as resistors, transistor and capacitors. The IC is housed in a package to allow it to be connected to other components such as on a circuit board. The package has external pins which can be connected to pads on a circuit board. For example, through-hole packages are generally larger and have pins which are designed to pass through one side of a circuit board and soldered to the other side. On the other hand, surface-mount packages are designed to sit on one side of a circuit board and be soldered to the surface.

BRIEF DESCRIPTION OF THE DRAWINGS

FIG. 1A depicts an example of an integrated circuit (IC) package 100 in communication with a short circuit test circuit 101.

FIG. 1B depicts an example of a configuration in which two pins of the IC package 100 of FIG. 1A communicate with the short circuit test circuit 101 via a multiplexer.

FIG. 1C depicts an example configuration in which the short circuit test circuit 101 is inside the IC package 100.

FIG. 2A depicts an example configuration of a leakage detection circuit for use in the short circuit test circuit 101 of FIGS. 1A and 1B.

FIG. 2B depicts an example configuration of the short circuit test circuit 101 of FIGS. 1A and 1B, consistent with FIG. 2A.

FIG. 3C depicts a flowchart of an example process for testing for a diode short circuit from a first pin to a second pin, consistent with FIG. 3A.

FIG. 3D depicts a flowchart of an example process for testing for a diode short circuit from a second pin to a first pin, consistent with FIG. 3A.

FIG. 3E depicts a flowchart of an example process for testing for a capacitive short circuit between first and second pins, consistent with FIG. 3A.

FIG. 3J depicts a flowchart of an example process for testing for a short circuit between P1 or P2 and a power supply, Vcc, consistent with FIG. 3A.

FIG. 4C depicts an example of the short circuit test circuit 101 of FIG. 2B, showing a short circuit path 407 between a first pin and ground, consistent with FIG. 3F.

FIG. 4D depicts an example of a variable voltage source 408 which outputs a variable Vref in the short circuit test circuit of FIG. 4C or 4E.

DETAILED DESCRIPTION

Figure 3A:
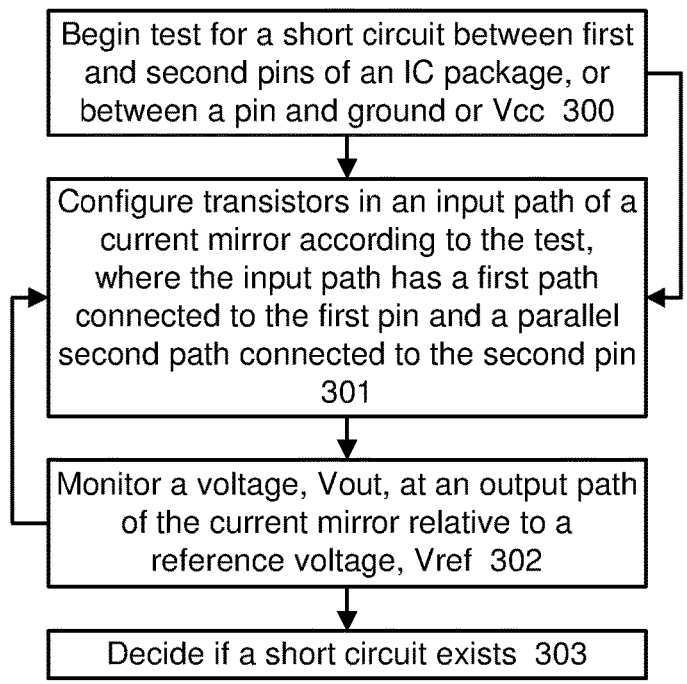
FIG. 3A depicts a flowchart of an example process for testing for a short circuit between first and second pins, consistent with the IC package of FIGS. 1A and 1B.

Apparatus and techniques are provided for detecting short circuits between pins in an integrated circuit (IC) package.

IC packages can be provided to house various types of circuits. The pins of the package allow the package to communicate with external components such as power supplies and controllers. For example, a memory device such as a flash memory device can include pins for read enable, write enable, chip enable, write protect, ready/busy, clock signal, a power supply voltage at Vcc and a ground point at Vss. Each pin typically communicates with a component within the IC package via a respective conductive path. For example, in FIG. 1A, a pin P1 communicates with a component 120 via a conductive path 121, and a pin P2 communicates with a component 122 via a conductive path 123. However, short circuits, such as the short circuit path 125, can occasionally develop between these paths during the fabrication process of a chip. A short circuit can impair the functioning of a chip.

Testing for short circuits can be problematic for various reasons. For example, some approaches require contacting each of the pins to probes to test a short circuit in a single pin. This increases the channel resources which are used in a tester, thereby also increasing the cost of the test.

Techniques and apparatuses provided herein address the above and other issues. In one approach, a test circuit is provided that can detect short circuits between pins of an IC package. The tested pins can be adjacent or non-adjacent on the package. Moreover, various types of short circuits can be detected, including resistive, diode and capacitive short circuits. Additionally, short circuits of a single pin can be tested, including a short circuit to a power supply or to ground.

In one approach, the test circuit comprises a current mirror 220 having an input path IP and an output path OP, as in FIG. 2B. The input path comprises a first path FP and a parallel second path SP. The first and second paths each comprise a pair of series-connected transistors. A first pin P1 of the IC package is connected between the transistors T1 and T2 of the first path and a second pin P2 of the IC package is connected between the transistors T3 and T4 of the second path. A comparator 213 is connected to the output path. By controlling the on and off states of the transistors, various types of short circuits for a single pin or between two pins can be detected.

The techniques can be used to screen IC packages for defects before releasing them to end users.

These and other benefits are further discussed below.

FIG. 1A depicts an example of an integrated circuit (IC) package 100 in communication with a short circuit test circuit 101. The IC package has eight pins P1-P8, as an example. An example short circuit path 125 is depicted between internal conductive paths 121 and 123 of the package. P1 communicates with a component 120 via the conductive path 121, and a pin P2 communicates with a component 122 via the conductive path 123. The components 120 and 122 are on a die 120a, for example. The IC package can contain one or more die having components. A single test circuit 101 can test for short circuits in multiple die. The test circuit 101 is on a die 101a in this example. When testing for short circuits, the layout of the conductive paths in the IC package can be considered. For example, paths which are very close together may be more likely to have short circuits. The pins connected to these paths can therefore be selected for a short circuit test. Or paths which are more likely to have short circuits due to considerations of the fabrication process can be selected for a short circuit test. Another approach is to test all of the pins for short circuits including testing all combinations of two pins. A multiplexer 228 such as depicted in FIG. 1B can be used for this purpose.

FIG. 1B depicts an example of a configuration in which two pins of the IC package 100 of FIG. 1A communicate with the short circuit test circuit 101 via a multiplexer 228. Each pin is connected via a respective conductive path in a set of conductive paths 227 to the multiplexer 228. The set of conductive paths 227 can be external to the IC package. The multiplexer can be controlled by the test circuit 101 to connect one of the external paths to the path 110 and another of the external paths to a path 111. Various short circuit tests can be performed by the circuit 101. A short circuit which is present within paths inside the IC package are detectable on the corresponding external paths and on the paths 110 and 111.

The test circuit 101 may include a control circuit 118, a memory 119, a current mirror 220 and a comparator 213. The control circuit can include, e.g., a state machine, a microprocessor, a microcontroller, a field-programmable gate array (FPGA), a hardware only circuit, a hardware with software circuit and so forth. The control circuit may access code such as firmware in a memory 119 to perform the functions described herein.

In this example, the test circuit 101 is external to the package 100 and its components, which may be on one or more die. FIG. 1C shows that the test circuit could be inside the IC package.

FIG. 1C depicts an example configuration in which the short circuit test circuit 101 is inside the IC package 100. The test circuit and its components, including the control circuit 118, memory 119, current mirror 220 and comparator 213 can be located inside the IC package on the same die or a different die as other components within the IC package, such as the components 120 and 122 of FIG. 1A, or the memory array 600 of FIG. 6. The test circuit 101 is on a die 101b in this example. A set of conductive paths 227a are connected between the pins, or to conductive paths within the IC package which are connected to the pins, and the multiplexer inside the IC package. The multiplexer can be controlled by the test circuit 101 to connect one of the conductive paths to the paths 110a and 111a for analysis by the test circuit. The test circuit can have an interface to an external component of the IC package to provide test results. In another option, some of the components of the test circuit are external to the die and other components of the test circuit are within the IC package.

FIG. 2A depicts an example configuration of a leakage detection circuit 200 for use in the short circuit test circuit 101 of FIGS. 1A and 1B. The circuit depicts a pin P connected to a path 226. The path may be connected to a power supply voltage Vcc via one electrostatic discharge (ESD) diode 201 and to ground via another ESD diode 202. The path further includes a resistance depicted by a resistor R and a capacitance C. The circuit can further include a pair 222 of series-connected transistors 223 and 224 which may be pMOS and nMOS transistors, respectively. In this case, a node 218 represents a source of the transistor 223, the node 225 represents a drain of the transistors 223 and 224, and the node 219 represents a source of the transistor 224. The path 226 is connected to a node 225 between the transistors, and to a buffer 217. The buffer can store data indicating the result of a short circuit test. In this and other figures, an inverted triangle denotes a ground point.

FIG. 2B depicts an example configuration of the short circuit test circuit 101 of FIGS. 1A and 1B, consistent with FIG. 2A. The test circuit comprises a current mirror 220 having an input path IP and an output path OP. The input path comprises a common portion CP, a first path FP and a second path SP, in parallel with the first path. The common portion comprises a transistor T5 such as a pMOS. A control gate of T5 is connected to another transistor T6 in the OP such as a pMOS via a path 209 to mirror a current on the input path to the output path. The input path and the output path are connected to a voltage Vcc of a power supply 215 via T5 and T6, respectively, and a path 221. The transistors T5 and T6 may have the same size so that the current mirror has a unity gain. In another option, the gain of the current mirror is greater than one. For example, a gain-boosted, cascode type of current mirror can be used.

The first path comprises a pair 204 of series-connected transistors T1 and T2 which may be pMOS and nMOS transistors, respectively. Generally, MOSFETs have the advantage of being voltage controlled so that they are easy to turn on and off. Moreover, MOSFETs are compatible with CMOS logic which may be used for input/output circuitry in a memory device. However, the transistors in the current mirror can be of a type of other than MOSFETs. For example, bipolar junction transistors (BJTs) can be used.

P1 and the path 110 are connected to a node 203 between T1 and T2. T1 is connected to the power supply on one side and to the node 203 on the other side. T2 is connected to ground on one side and to the node 203 on the other side. By providing T1 in the off (non-conductive) state, a current on the path 207 is blocked from reaching the path 110. By providing T1 in the on (conductive) state and T2 in the off state, a current on the path 207 is allowed to reach the path 110 and prevented from reaching ground via T2. By providing T1 and T2 in the on state, a current on the path 207 is allowed to reach ground.

The second path also comprises a pair 206 of series-connected transistors T3 and T4 which may be pMOS and nMOS transistors, respectively. P2 and the path 111 are connected to a node 205 between T3 and T4. T3 is connected to the power supply on one side and to the node 205 on the other side. T4 is connected to ground on one side and to the node 205 on the other side. By providing T3 in the off state, a current on the path 208 is blocked from reaching the path 111. By providing T3 in the on state and T4 in the off state, a current on the path 208 is allowed to reach the path 111 and prevented from reaching ground via T4. By providing T3 and T4 in the on state, a current on the path 208 is allowed to reach ground.

In one approach, each of the transistors T1-T4 can be independently provided in the on or off state by the control circuit 118 by proving an appropriate control gate voltage for the transistors. For example, a pMOS or nMOS transistor can be provided in a conductive state by providing a negative or positive control gate voltage, respectively. A pMOS or nMOS transistor is typically in the non-conductive state when the control gate voltage is 0 V.

The output path includes a resistor R1 as a load which allow a current to flow and which develops a voltage Vout on the node 210. Vout and a reference voltage, Vref, are input to a comparator 213 to provide an output voltage, Vcomp, of the comparator on a path 214. In this example, Vout is input to a non-inverting input node 211 and Vref is input to an inverting input node 212 of the comparator. The comparator is an example of an op-amp comparator circuit. When Vout<=Vref, Vcomp is high. When Vout>Vref, Vcomp is low. Accordingly, Vcomp provides an indication of the current flow and voltage in the output path and therefore on the input path. Vcomp can be interpreted by the control circuit 118 to determine whether a short circuit exists between the pins P1 and P2, or for either pin alone.

FIG. 3A depicts a flowchart of an example process for testing for a short circuit between first and second pins, consistent with the IC package of FIGS. 1A and 1B. Step 300 begins a test for a short circuit between first and second pins of an IC package, or between a pin and ground or Vcc. Step 301 includes configuring transistors in an input path of a current mirror according to the test, where the input path IP comprises a first path FP connected to the first pin and a parallel second path SP connected to the second pin, such as depicted in FIG. 2B. Step 302 includes monitoring a voltage, Vout, at an output path of the current mirror relative to a reference voltage, Vref. Steps 301 and 302 can be performed once or more depending on the test. Step 303 includes deciding if a short circuit exists, e.g., based on the monitoring of step 302. Various example implementations of the process are depicted below.

The process can be repeated for different combinations of two pins of an IC package.

Figure 3B:
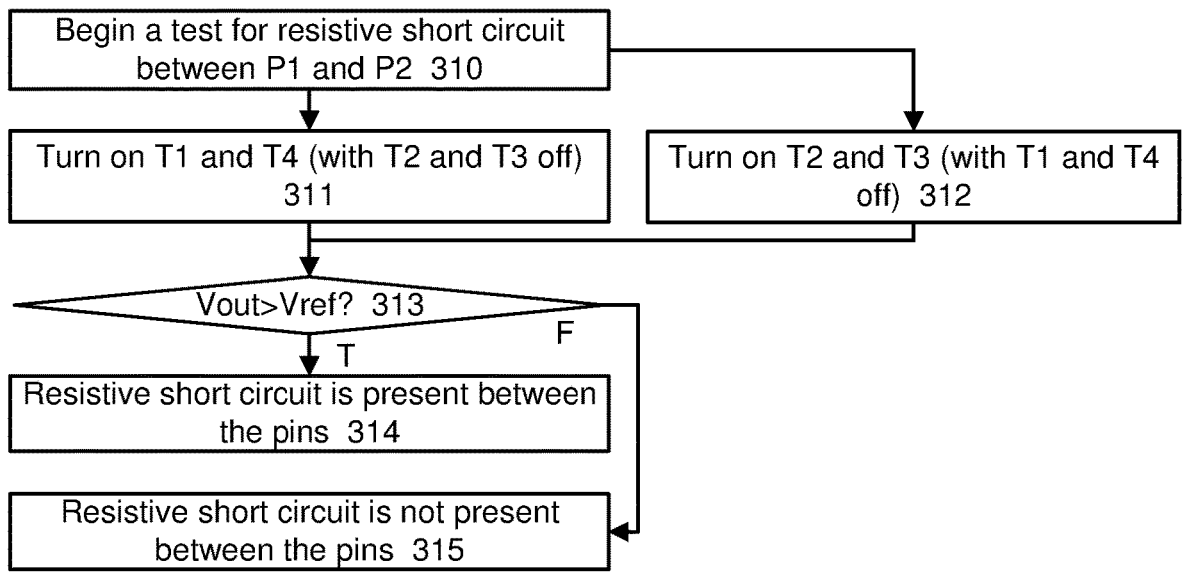
FIG. 3B depicts a flowchart of an example process for testing for a resistive short circuit between first and second pins, consistent with FIG. 3A.

FIG. 3B depicts a flowchart of an example process for testing for a resistive short circuit between first and second pins, consistent with FIG. 3A. A resistive short circuit means there is a resistance between the two pins. Step 310 begins a test for a resistive short circuit between P1 and P2. Step 311 depicts a first approach of turning on T1 and T4 (with T2 and T3 off). Step 312 depicts a second approach of turning on T2 and T3 (with T1 and T4 off). A decision step 313 determines whether Vout>Vref. If the decision step 313 is true (T), step 314 indicates that a resistive short circuit is present between the pins. If the decision step 313 is false (F), step 315 indicates that a resistive short circuit is not present between the pins. Another approach is to require that Vout>Vref by a threshold in order for step 314 to be reached. In one example, Vref=0 V and Vout is expected to be 0 V if there is no resistive short circuit. If Vcomp indicates Vout>0 V, this indicates there is a resistive short circuit.

Figure 4A:
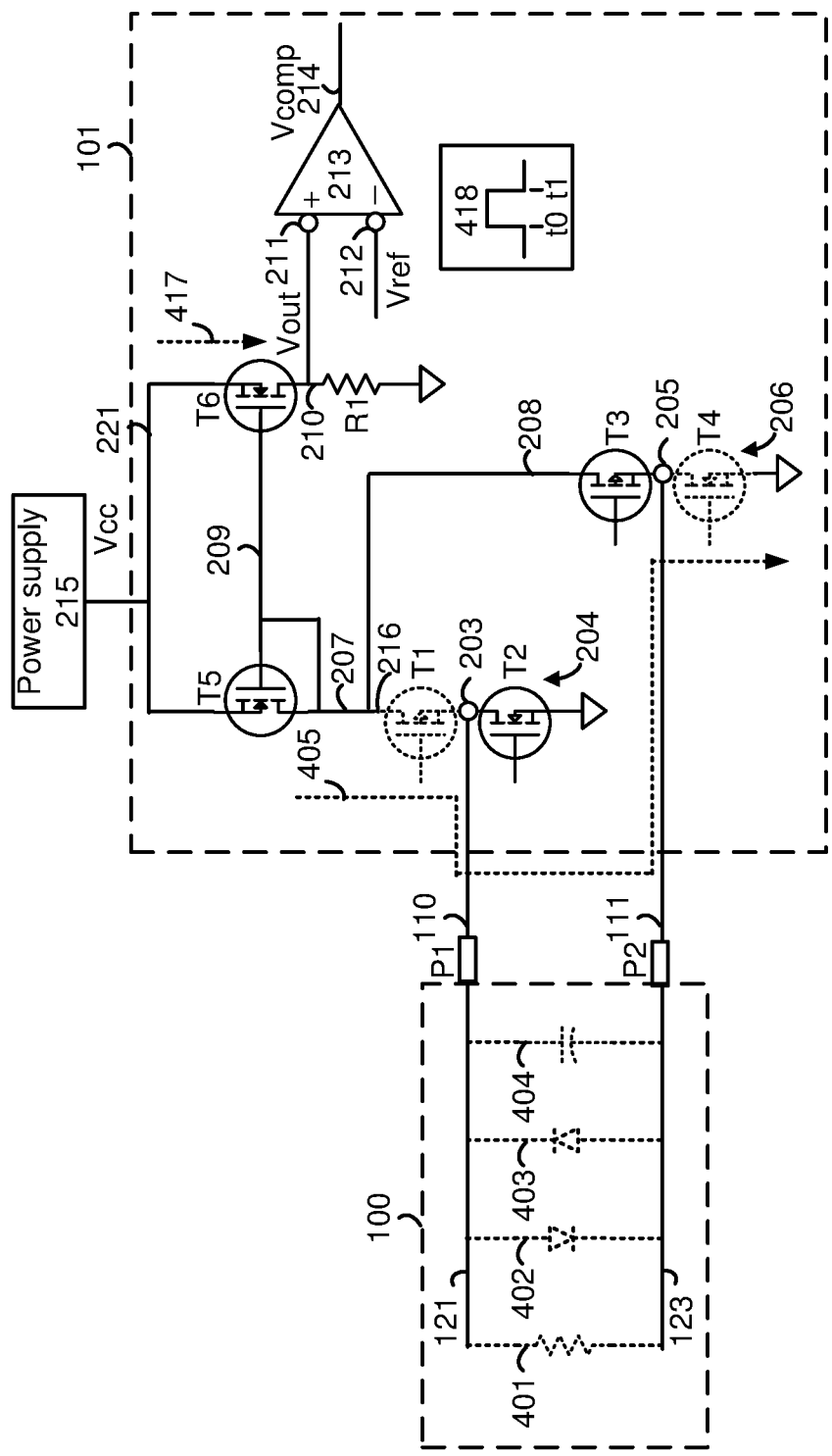
FIG. 4A depicts an example of the short circuit test circuit 101 of FIG. 2B, showing a resistive short circuit path 401 consistent with FIG. 3B, a diode short circuit path 402 from P1 to P2 consistent with FIG. 3C, a diode short circuit path 403 from P2 to P1 consistent with FIG. 3D and a capacitive short circuit path 404 consistent with FIG. 3E.
Figure 4B:
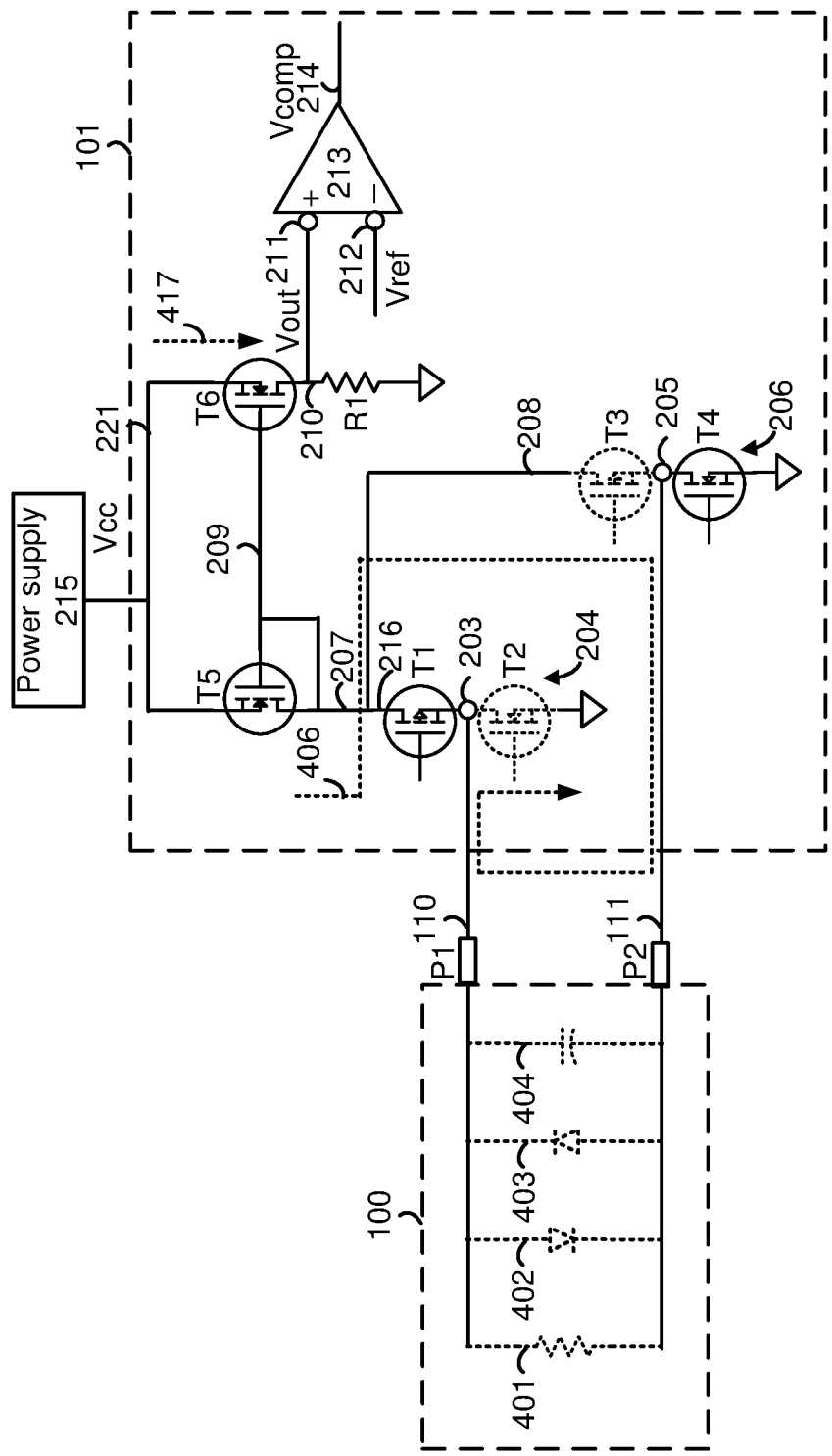
FIG. 4B depicts an example of the short circuit test circuit 101 of FIG. 2B, showing a current path 406 from P2 to P1.

See also FIGS. 4A and 4B which correspond to steps 311 and 312, respectively. In FIG. 4A, the current 405 flows in the path 207, to the path 216, to the path 110, through the resistive short circuit 401 to the path 111, through T4 and then to ground. In FIG. 4B, the current 406 flows in the path 207, to the path 208, through T3, to the path 111, through the resistive short circuit 401 to the path 110, through T2 and then to ground. A current path 417 is generated at the node 210 for detection by the comparator.

FIG. 3C depicts a flowchart of an example process for testing for a diode short circuit from a first pin to a second pin, consistent with FIG. 3A. A diode short circuit from P1 to P2 means there is a current flow from P1 to P2. Step 320 begins a test for a diode short circuit from P1 to P2. Step 321 includes turning on T1 and T4 (with T2 and T3 off). Step 322 includes determining a first output, e.g., Vout1. Step 323 includes turning on T2 and T3 (with T1 and T4 off). Step 324 includes determining a second output, e.g., Vout2. These are outputs of the current mirror which can be detected from the output of the comparator and the level of Vref. A decision step 325 determines whether the absolute value of Vout1-Vout2 is greater than a threshold. The threshold can be 0 V or higher. If the decision step 325 is true, step 326 indicates that a diode short circuit is present from P1 to P2. If the decision step 325 is false, step 327 indicates that a diode short circuit is not present from P1 to P2. The process detects whether Vout is greater when the current is allowed to flow from P1 to P2, compared to when the current is allowed to flow from P2 to P1.

See also FIG. 4A which depicts a current flow in step 321. The current 405 flows in the path 207, to the path 216, to the path 110, through the P1 to P2 diode short circuit 402 to the path 111, through T4 and then to ground. In step 323, the current does not flow in the opposite direction, from the path 111 to the path 110, because the diode short circuit 402 allows only a one way current flow. Vout will therefore be non-zero, e.g., a positive voltage, during step 321 but 0 V during step 323 since no current flows in the current mirror. The control circuit can determine from these outputs that the diode short circuit 402 is present.

FIG. 3D depicts a flowchart of an example process for testing for a diode short circuit from a second pin to a first pin, consistent with FIG. 3A. This approach is similar to that of FIG. 3C but detects the diode short circuit 403 in FIG. 4B, from P2 to P1. A diode short circuit from P2 to P1 means there is a current flow from P2 to P1. Step 330 begins a test for a diode short circuit from P2 to P1. Step 331 includes turning on T2 and T3 (with T1 and T4 off). Step 332 includes determining a first output, e.g., Vout1. Step 333 includes turning on T1 and T4 (with T2 and T3 off). Step 334 includes determining a second output, e.g., Vout2. A decision step 335 determines whether the absolute value of Vout1-Vou2 is greater than a threshold. If the decision step 335 is true, step 336 indicates that a diode short circuit is present from P2 to P1. If the decision step 335 is false, step 337 indicates that a diode short circuit is not present from P2 to P1. The process detects whether Vout is greater when the current is allowed to flow from P2 to P1, compared to when the current is allowed to flow from P1 to P2.

See also FIG. 4B which depicts a current flow in step 331. The current 406 flows in the path 207, to the path 208, through T3, to the path 111, through the diode short circuit 403 to the path 110, through T2 and then to ground. In step 333, the current does not flow in the opposite direction, from the path 110 to the path 111, because the diode short circuit 403 allows only a one way current flow. Vout will therefore be non-zero, e.g., a positive voltage, during step 331 but 0 V during step 333 since no current flows in the current mirror. The control circuit can determine from these outputs that the diode short circuit 403 is present.

FIG. 3E depicts a flowchart of an example process for testing for a capacitive short circuit between first and second pins, consistent with FIG. 3A. A capacitive short circuit means there is a capacitance between the two pins. Step 340 begins a test for a capacitive short circuit between P1 and P2. Step 341 depicts a first approach of turning on T1 and T4 (with T2 and T3 off). Step 342 depicts a second approach of turning on T2 and T3 (with T1 and T4 off). A decision step 343 determines whether there is a voltage pulse at the output, e.g., in Vout. See the example voltage pulse 418 in FIG. 4A. If the decision step 343 is true, step 344 indicates that a capacitive short circuit is present between the pins. If the decision step 343 is false, step 345 indicates that a capacitive short circuit is not present between the pins. The process detects the capacitive short circuit based on whether Vout comprises a voltage pulse.

See also FIGS. 4A and 4B which correspond to steps 341 and 342, respectively. In FIG. 4A, the current 405 initially flows in the path 207, to the path 216, to the path 110, and to the capacitive short circuit 404. The capacitor is initially uncharged, but charges up due to the current on the path 110 until it is fully charged, at which time the current 405 stops. The capacitive short circuit prevents the current from flowing to the path 111. This brief period of charging results in a voltage pulse 418 in a time period t0-t1 at the node 210, in Vout, and on the path 214, in Vcomp. The control circuit can detect this pulse to determine that the capacitive short circuit is present.

In FIG. 4B, the current 406 flows in the path 207, to the path 208, through T3, and to the path 111, charging up the capacitive short circuit as discussed.

Figure 3F:
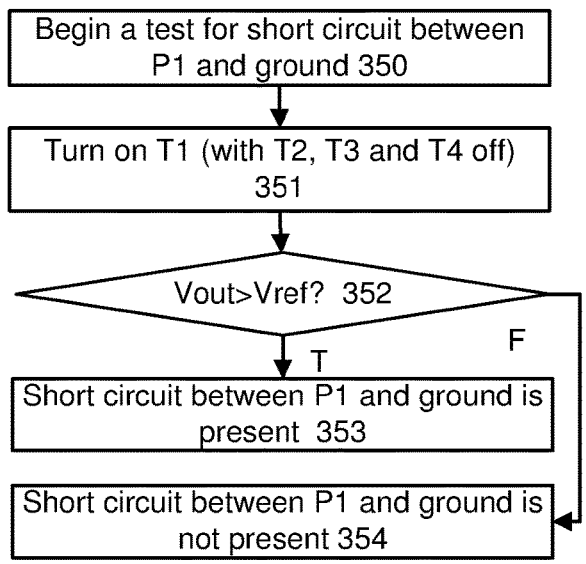
FIG. 3F depicts a flowchart of an example process for testing for a short circuit between a first pin and ground, consistent with FIG. 3A.

FIG. 3F depicts a flowchart of an example process for testing for a short circuit between a first pin and ground, consistent with FIG. 3A. Step 350 begins a test for a short circuit between P1 and ground. Step 351 includes turning on T1 (with T2, T3 and T4 off). A decision step 352 determines whether Vout>Vref. Or, the decision step 352 can determine whether Vout-Vref exceeds a threshold. With no short circuit to ground, no current should flow in the current mirror such that Vout=0 V. With a short circuit to ground, a current flow results in Vout>0 V.

If the decision step 352 is true, step 353 indicates that a short circuit between P1 and ground is present. If the decision step 352 is false, step 354 indicates that a short circuit between P1 and ground is not present. In one example, Vref=0 V and Vout is expected to be 0 V if there is no short circuit between the first pin and ground. If Vcomp indicates Vout>0 V, this indicates there is a short circuit between the first pin and ground.

See also FIG. 4C. When the short circuit path 407 to ground is present for P1, a current path 420 is provided in the path 207, to the path 216, through T1, to the path 110, and to ground via the short circuit path 407. This results in a non-zero Vout which can be detected from Vcomp by the control circuit.

Figure 3G:
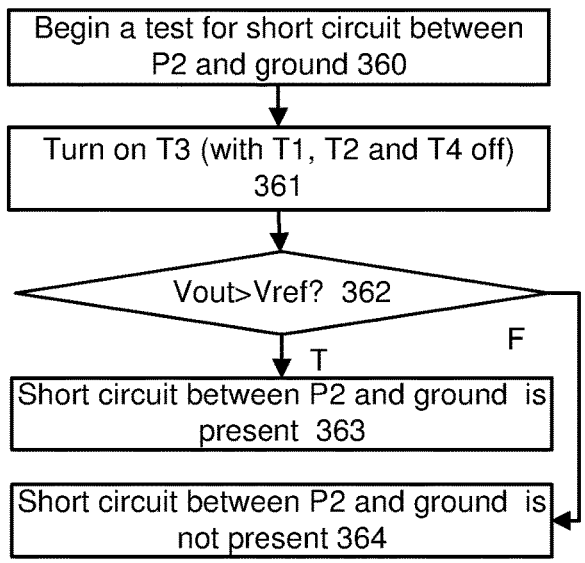
FIG. 3G depicts a flowchart of an example process for testing for a short circuit between a second pin and ground, consistent with FIG. 3A.

FIG. 3G depicts a flowchart of an example process for testing for a short circuit between a second pin and ground, consistent with FIG. 3A. Step 360 begins a test for a short circuit between P2 and ground. Step 361 includes turning on T3 (with T1, T2 and T4 off). A decision step 362 determines whether Vout>Vref. Or, the decision step 362 can determine whether Vout-Vref exceeds a threshold. With no short circuit to ground, no current should flow in the current mirror such that Vout=0 V. With a short circuit to ground, a current flow results in Vout>0 V.

If the decision step 362 is true, step 363 indicates that a short circuit between P2 and ground is present. If the decision step 362 is false, step 364 indicates that a short circuit between P2 and ground is not present.

Figure 4E:
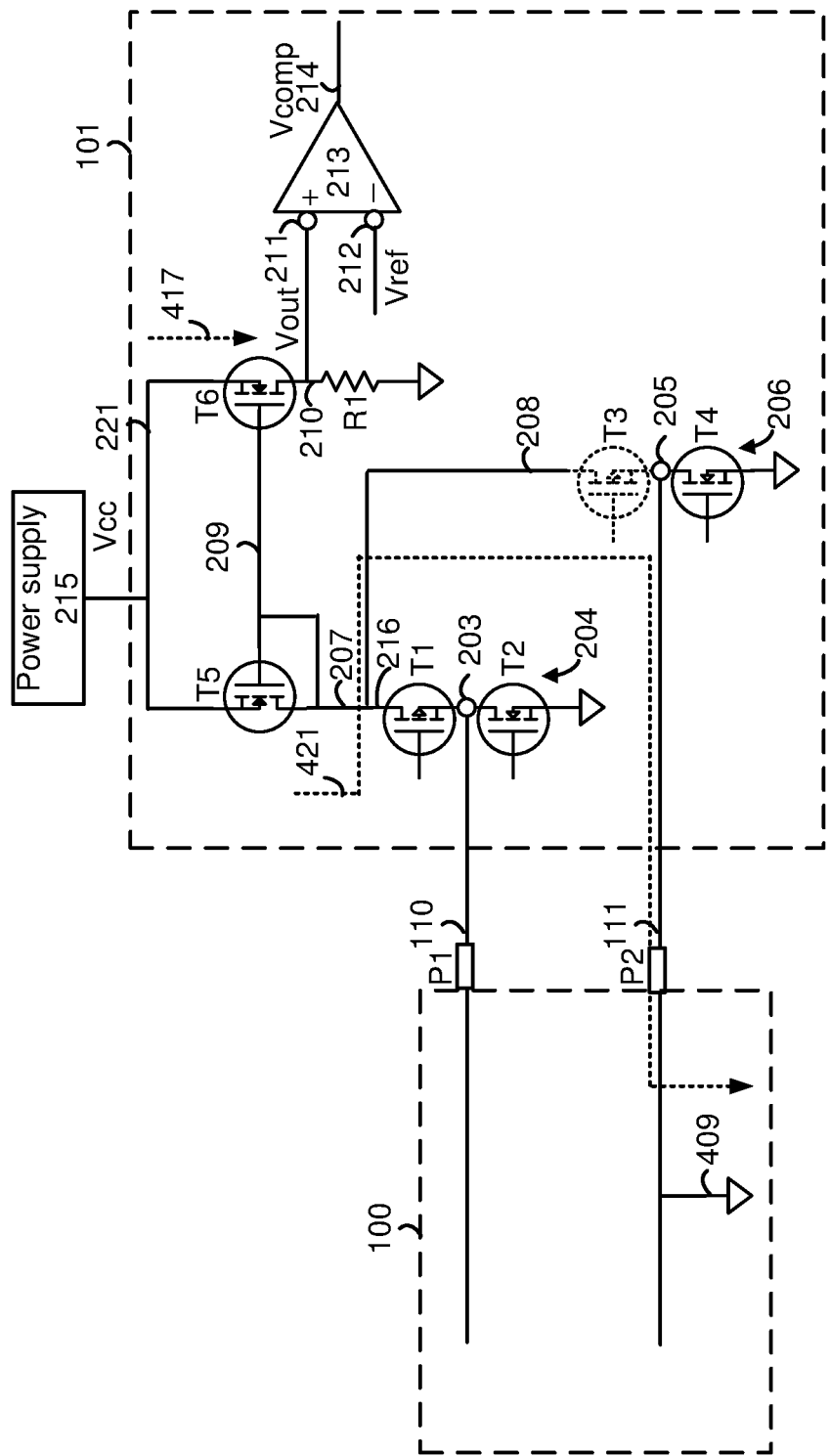
FIG. 4E depicts an example of the short circuit test circuit 101 of FIG. 2B, showing a short circuit path 409 between a second pin and ground, consistent with FIG. 3G.

See also FIG. 4E. When the short circuit path 409 to ground is present for P2, a current path 421 is provided in the path 207, to the path 216, through T3, to the path 111, and to ground via the short circuit path 409. This results in a non-zero Vout which can be detected from Vcomp by the control circuit.

Figure 3H:
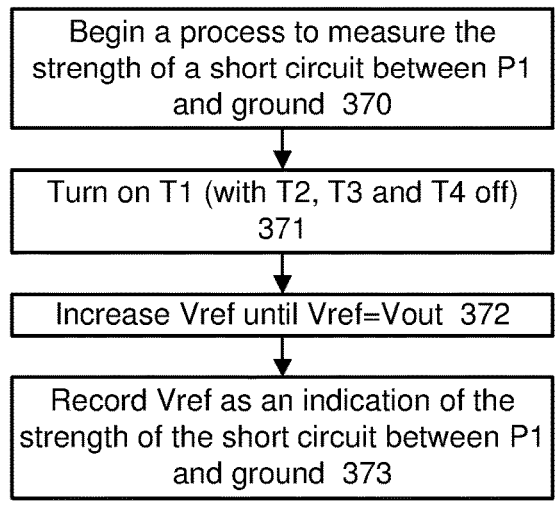
FIG. 3H depicts a flowchart of an example process for measuring a strength of the short circuit between the first pin and ground, consistent with FIG. 3F.

FIG. 3H depicts a flowchart of an example process for measuring a strength of the short circuit between the first pin and ground, consistent with FIG. 3F. The process can follow the process of FIG. 3F, in one approach, when a short circuit is detected. Or, the process of FIG. 3H can be combined with the process of FIG. 3F. In this approach, a variable voltage source 408 as depicted in FIG. 4D can be used to vary or adjust the level of Vref. Vref can be increased starting from an initial level such as 0 V to measure the strength of a short circuit. Vout will exceed Vref until Vref is equal to Vout. This level of Vref denotes the strength of the short circuit.

Step 370 begins a process to measure the strength of a short circuit between P1 and ground. Step 371 includes turning on T1 (with T2, T3 and T4 off). Step 372 includes increasing Vref until Vref=Vout. A change in Vcomp indicates Vref=Vout. Step 373 includes recording Vref as an indication of the strength of the short circuit between P1 and ground. Note that the measured strength can be used in various ways such as to diagnose a defect in the IC package. In one approach, the IC package may not be considered to be defective if the measured strength is below a threshold. The IC package is defective if the measured strength is above the threshold.

Figure 3I:
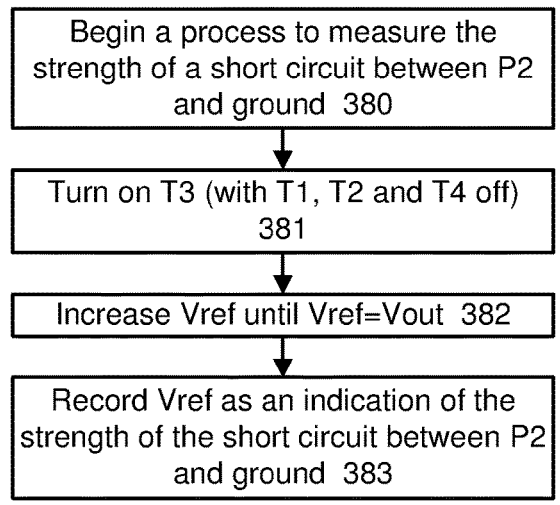
FIG. 3I depicts a flowchart of an example process for measuring a strength of the short circuit between the first pin and ground, consistent with FIG. 3G.

FIG. 3I depicts a flowchart of an example process for measuring a strength of the short circuit between the first pin and ground, consistent with FIG. 3G. Step 380 begins a process to measure the strength of a short circuit between P2 and ground. Step 381 includes turning on T3 (with T1, T2 and T4 off). Step 382 includes increasing Vref until Vref=Vout. A change in Vcomp indicates Vref=Vout. Step 383 includes recording Vref as an indication of the strength of the short circuit between P1 and ground.

FIG. 3J depicts a flowchart of an example process for testing for a short circuit between P1 or P2 and a power supply, Vcc, consistent with FIG. 3A. Step 390 begins a test for a short circuit between P1 or P2 and Vcc. Step 391 includes turning on T1 and T2 (with T3 and T4 off). Step 392 includes determining a first output, Vout1. Step 393 includes turning on T3 and T4 (with T1 and T2 off). Step 394 includes determining a second output, Vout2. Vout1 and Vout2 can be determined based on Vcomp and Vref. A decision step 395 determines whether Vout1<Vout2. If the decision step 395 is true, step 396 indicates that a short circuit between P1 and Vcc is present. If the decision step 395 is false, step 397 indicates that a short circuit between P1 and Vcc is not present.

Additionally, a decision step 398 determines whether Vout2<Vout1. If the decision step 398 is true, step 399 indicates that a short circuit between P2 and Vcc is present. If the decision step 398 is false, step 400 indicates that a short circuit between P2 and Vcc is not present.

If Vout1=Vout2, there is no short circuit between the first or second pin and ground. If Vout1 and Vout2 differ, the decision steps 395 and 398 indicate whether the first or second pin, respectively, is short circuited to Vcc.

Figure 4F:
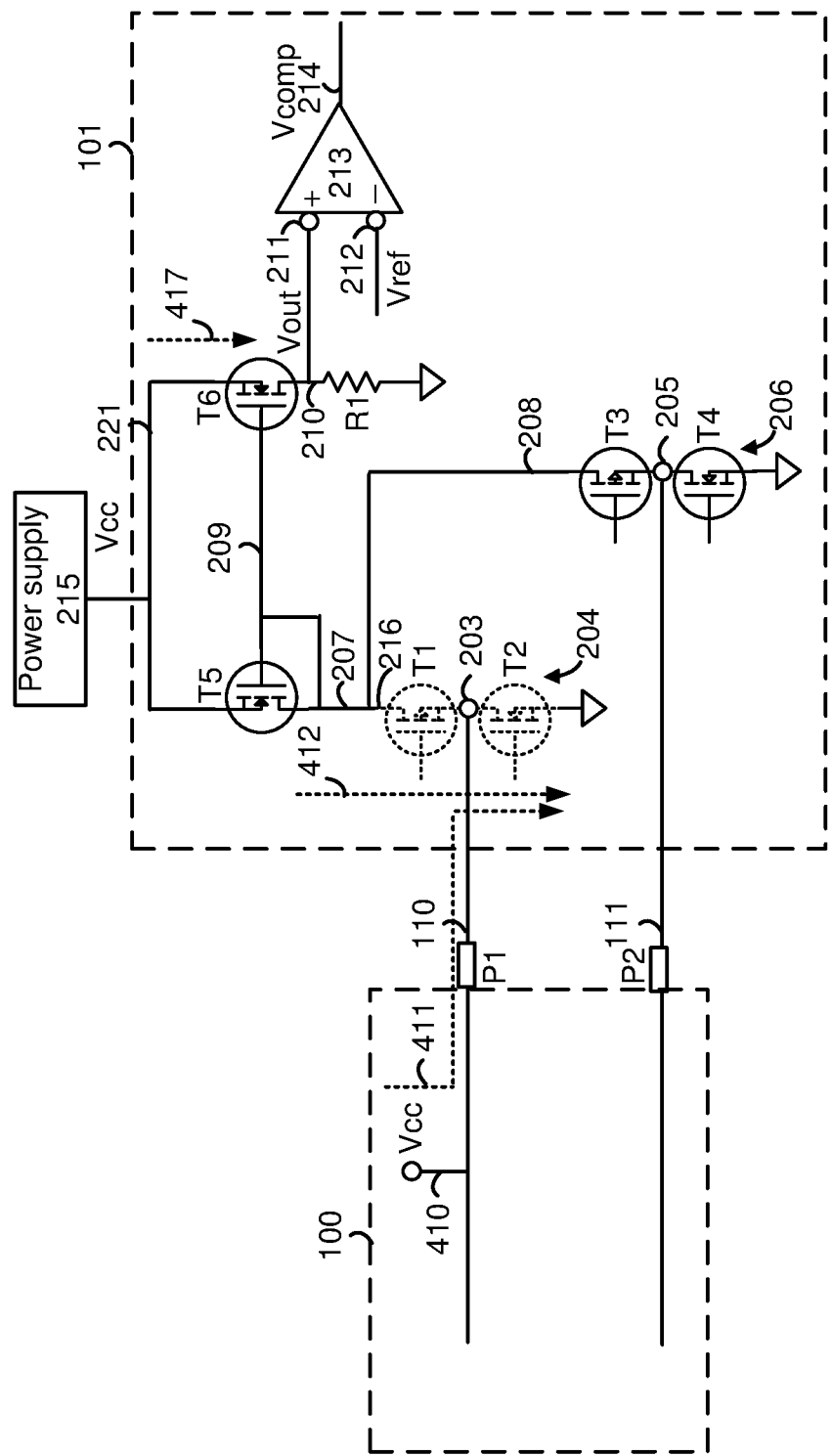
FIG. 4F depicts an example of the short circuit test circuit 101 of FIG. 2B, showing a short circuit path 410 of a first pin to a power supply, and current paths 411 and 412, consistent with FIG. 3J.

See also FIG. 4F. If a short circuit path 410 is present between P1 and Vcc, a current 411 will flow from the power supply to the path 110, through T2 and to ground. The Vcc in the IC package can be the same as, or different than, the Vcc of the power supply 215 of the test circuit 101. The short circuit may be weak such that only a portion of Vcc is present on the path 110. This portion of Vcc will also be present at the node 203, reducing the voltage between the path 221 and the node 203. For example, assume Vcc=3 V and 1 V is present on the path 110 and the node 203. The voltage between the path 221 and the node 203 will be 3−1=2 V and the voltage between the node 203 and ground will be 1−0=1 V. The short circuit path 410 therefore reduces the voltage which is mirrored to the output path, so that Vout also drops, to 2 V, for instance. A current 412 will flow from the path 207, to the path 216, and through T1 and T2 to ground. This current will combine with the current on path 110 and flow to ground via T2. The current 412 is lower when the voltage between the path 221 and the node 203 is lower.

Figure 4G:
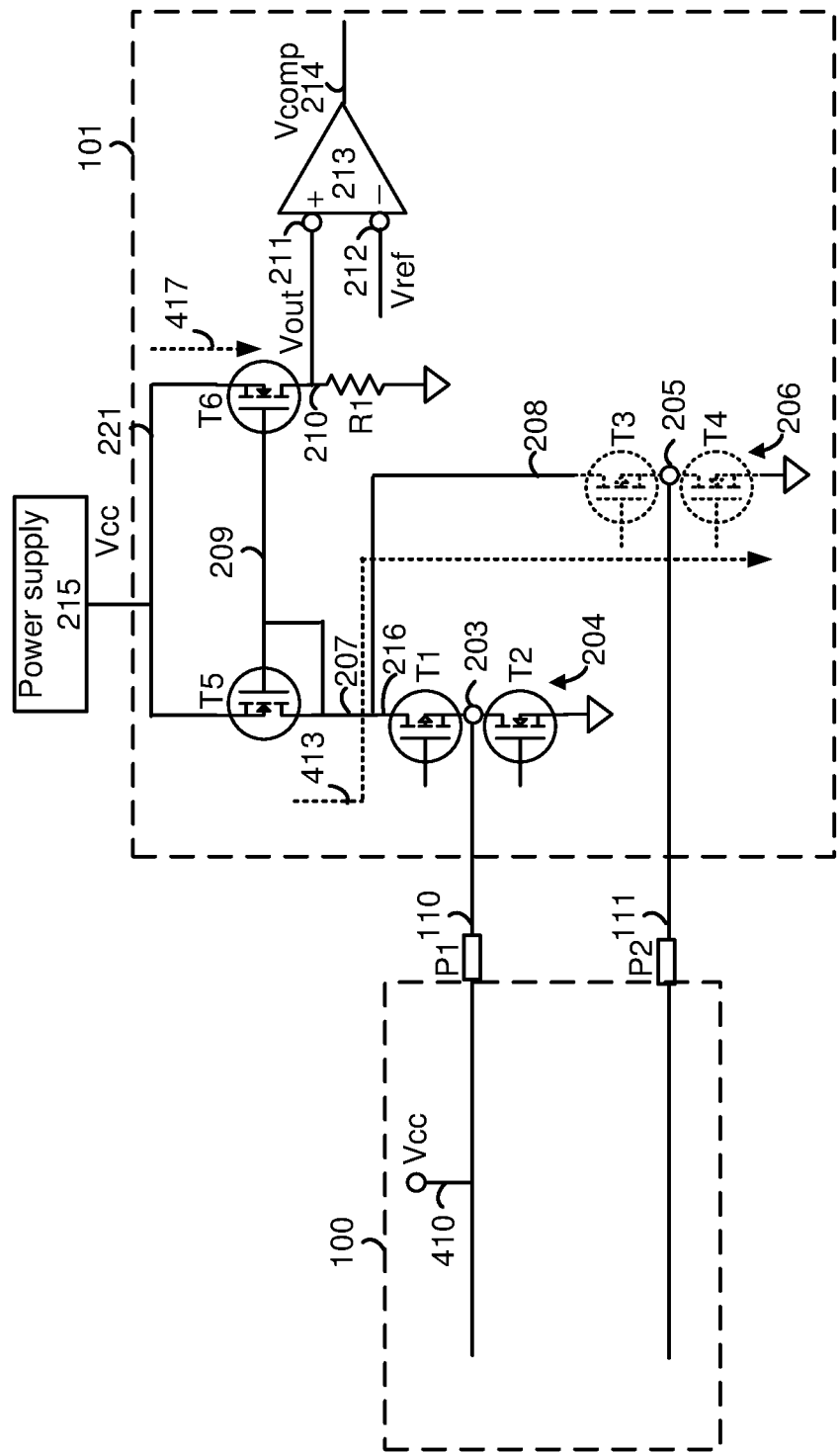
FIG. 4G depicts an example of the short circuit test circuit 101 of FIG. 2B, showing the short circuit path 410 of FIG. 4G and a current path 413.
Figure 4H:
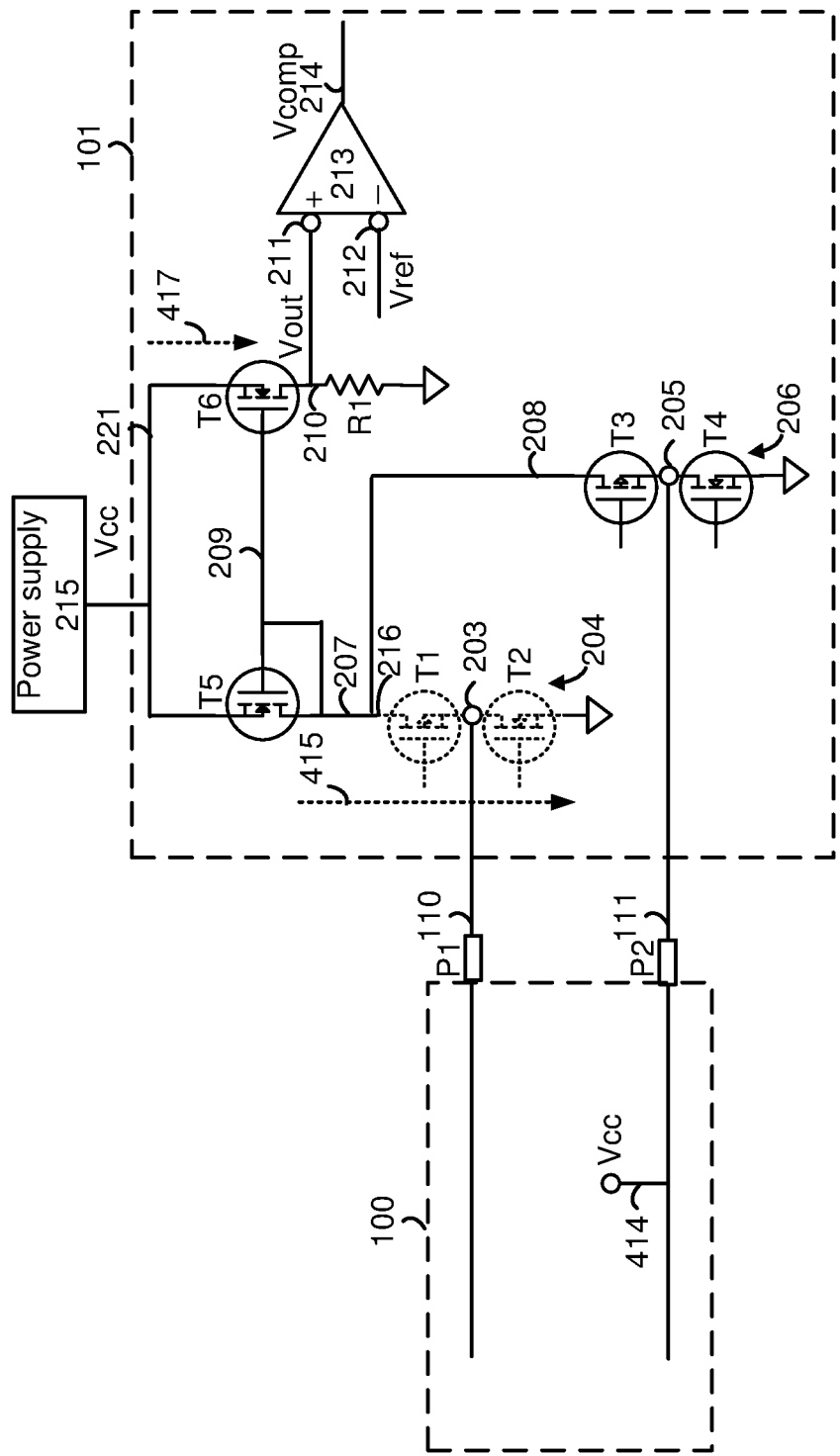
FIG. 4H depicts an example of the short circuit test circuit 101 of FIG. 2B, showing a short circuit path 414 of a second pin to a power supply, and a current path 415, consistent with FIG. 3J.
Figure 4I:
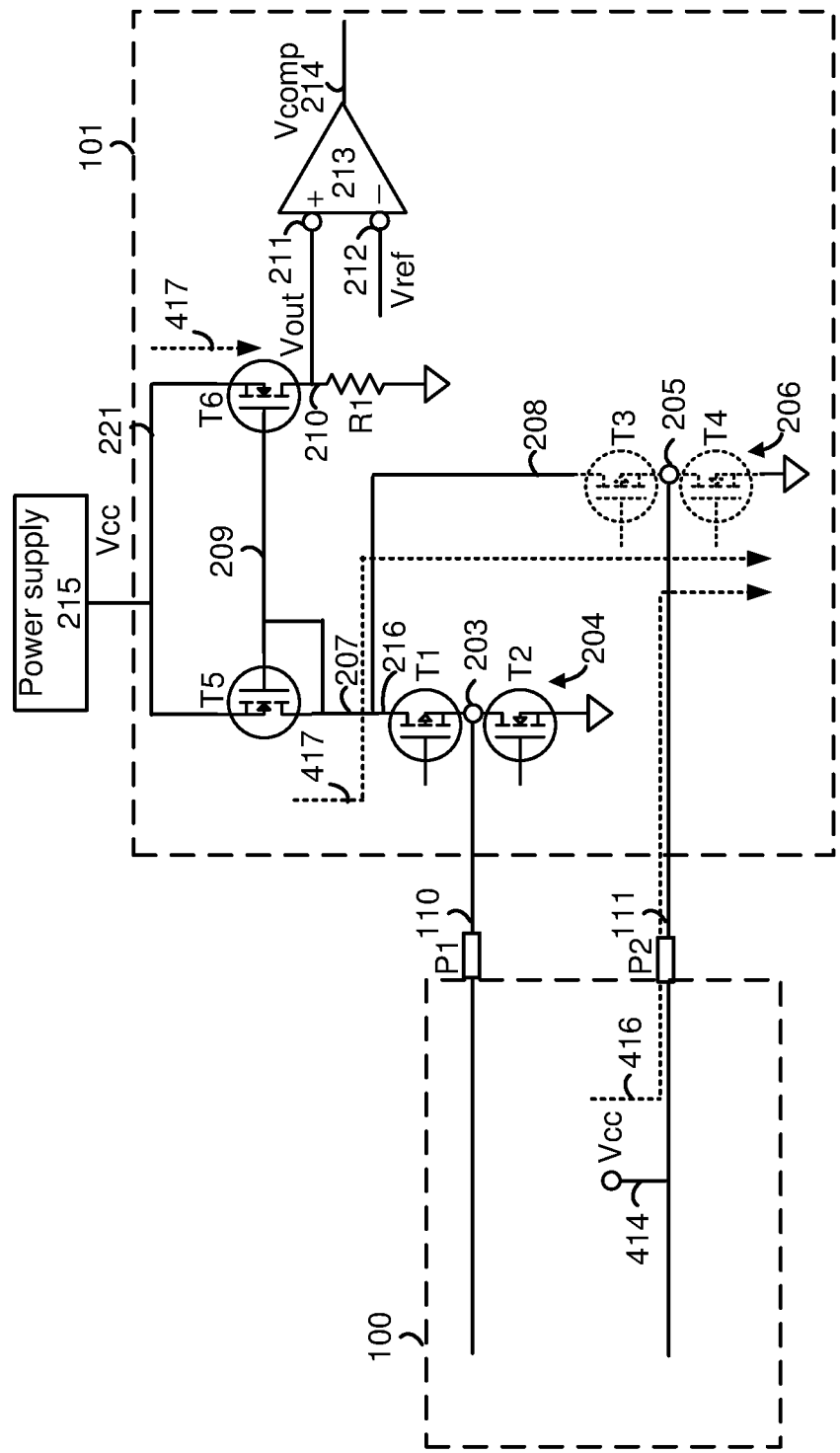
FIG. 4I depicts an example of the short circuit test circuit 101 of FIG. 2B, showing the short circuit path 414 and current paths 416 and 417.

Similarly, in FIG. 4I, if a short circuit path 414 is present between P2 and Vcc of the IC package, a current 416 will flow from the power supply to the path 111, through T4 and to ground. The short circuit may be weak such that only a portion of Vcc is present on the path 111. This portion of Vcc will also be present at the node 205, reducing the voltage between the path 221 and the node 205. For example, assume Vcc=3 V and 1 V is present on the path 111 and the node 205. The voltage between the path 221 and the node 205 will be 3−1=2 V and the voltage between the node 205 and ground will be 1−0=1 V. The short circuit path 414 therefore reduces the voltage which is mirrored to the output path, so that Vout also drops, to 2 V, for instance. A current 417 will flow from the path 207, to the path 208, and through T3 and T4 to ground. This current will combine with the current on path 111 and flow to ground via T4.

In FIGS. 4A-4C and 4E-4I, a dashed line transistor represents a transistor in the conductive state and a solid line transistor represents a transistor in the non-conductive state.

FIG. 4A depicts an example of the short circuit test circuit 101 of FIG. 2B, showing a resistive short circuit path 401 consistent with FIG. 3B, a diode short circuit path 402 from P1 to P2 consistent with FIG. 3C, a diode short circuit path 403 from P2 to P1 consistent with FIG. 3D and a capacitive short circuit path 404 consistent with FIG. 3E. A current path 405 from P1 to P2 is also depicted. The short circuit paths are within the IC package 100, e.g., between the internal paths 121 and 123 which are connected to the paths 110 and 111, respectively. The pins P1 and P2 are examples, as any two pins can be used including adjacent or non-adjacent pins on the IC package.

The circuit 101 includes a current mirror 220 comprising an input path and an output path, as mentioned in connection with FIG. 2B. The transistors T1-T4 can be provided in an on or off state to create current paths which involve the pins and their associated paths 110 and 111. If a defect such as a short circuit exists within the IC package in paths which are connected to the pins, the defect will allow a current to flow between the paths 110 and 111, or in the paths 110 or 111. For example, the resistive short circuit path 401, and the diode short circuit paths 402 and 403 can allow a current to flow between the paths. The capacitive short circuit path 404 allows a current to temporarily flow in one of the paths 110 or 111.

In this example, T1 is on so that the current path 405 can potentially exist. A current in the path 207 and 216 is passed through T1 to the path 110 where it can pass to the path 111 if one of the short circuit paths 401 and 402 exist. T4 is on so that a current on the path 111 can travel to ground. T2 is off so that the current path 405 cannot travel through T2 to ground. Similarly, T3 is off so that any current on the path 208 cannot travel through T3 to ground via T4.

FIG. 4B depicts an example of the short circuit test circuit 101 of FIG. 2B, showing a current path 406 from P2 to P1. In this example, T3 is on so that the current path 406 can potentially exist. A current in the path 207 is passed to the path 208, through T3 and to the path 111 where it can pass to the path 110 if one of the short circuit paths 401 and 403 exist. T2 is on so that a current on the path 110 can travel to ground. T1 is off so that the current path 406 cannot travel through T1. Similarly, T4 is off so that current path 406 cannot travel to ground via T4.

FIG. 4C depicts an example of the short circuit test circuit 101 of FIG. 2B, showing a short circuit path 407 between a first pin and ground, consistent with FIG. 3F. In this example, T1 is on so that the current path 420 can potentially exist. A current in the path 207 is passed through T1 to the path 110 where it can pass to ground if the short circuit path 407 exists. T2 is off so that the current path 420 cannot travel through T2 to ground. Similarly, T3 is off so that any current on the path 208 cannot travel through T3 to ground via T4.

FIG. 4D depicts an example of a variable voltage source 408 which outputs a variable Vref in the short circuit test circuit of FIG. 4C or 4E. Vref is provided to the input node 212 of the comparator 213.

FIG. 4E depicts an example of the short circuit test circuit 101 of FIG. 2B, showing a short circuit path 409 between a second pin and ground, consistent with FIG. 3G. In this example, T3 is on so that the current path 421 can potentially exist. A current in the path 207 is passed to the path 208, through T3 and to the path 111 where it can pass to ground if the short circuit path 409 exists. T1 and T2 are off so that the current path 421 cannot travel to ground via T1 and T2. T4 is off so that the current path 421 cannot travel to ground via T4.

FIG. 4F depicts an example of the short circuit test circuit 101 of FIG. 2B, showing a short circuit path 410 of a first pin to a power supply, and current paths 411 and 412, consistent with FIG. 3J. In this example, T1 and T2 are on so that the current paths 411 and 412 can exist. A current path 411 in the short circuit path 410 is passed to the path 110 and then to ground via T2. At the same time, a current path 412 is passed to ground via T1 and T2. T3 is off so that the current path 412 cannot travel to ground via T3 and T4. As mentioned, the current path 411 reduces the level of the current path 412 and this reduction can be detected in Vout.

FIG. 4G depicts an example of the short circuit test circuit 101 of FIG. 2B, showing the short circuit path 410 of FIG. 4G and a current path 413. In this example, T3 and T4 are on so that the current path 413 exists. The current path 413 is passed to ground via T3 and T4. T1 is off so that the current path 413 cannot travel to the path 110 via T1 or to ground via T1 and T2.

FIG. 4H depicts an example of the short circuit test circuit 101 of FIG. 2B, showing a short circuit path 414 of a second pin to a power supply, and a current path 415, consistent with FIG. 3J. In this example, T1 and T2 are on so that the current path 415 is passed to ground via T1 and T2. T3 is off so that the current path 415 cannot travel to ground via T3 and T4.

FIG. 4I depicts an example of the short circuit test circuit 101 of FIG. 2B, showing the short circuit path 414 and current paths 416 and 417. In this example, T3 and T4 are on so that the current paths 416 and 417 can potentially exist. A current path 416 in the short circuit path 414 is passed to the path 111 and then to ground via T4. At the same time, a current path 417 is passed to ground via T3 and T4. T1 is off so that the current path 417 cannot travel to ground via T1 and T2. As mentioned, the current path 416 reduces the level of the current path 417 and this reduction can be detected in Vout.

In FIG. 4F-4I, the transistors T1-T4 can be long channel devices to limit a crowbar current.

Figure 5:
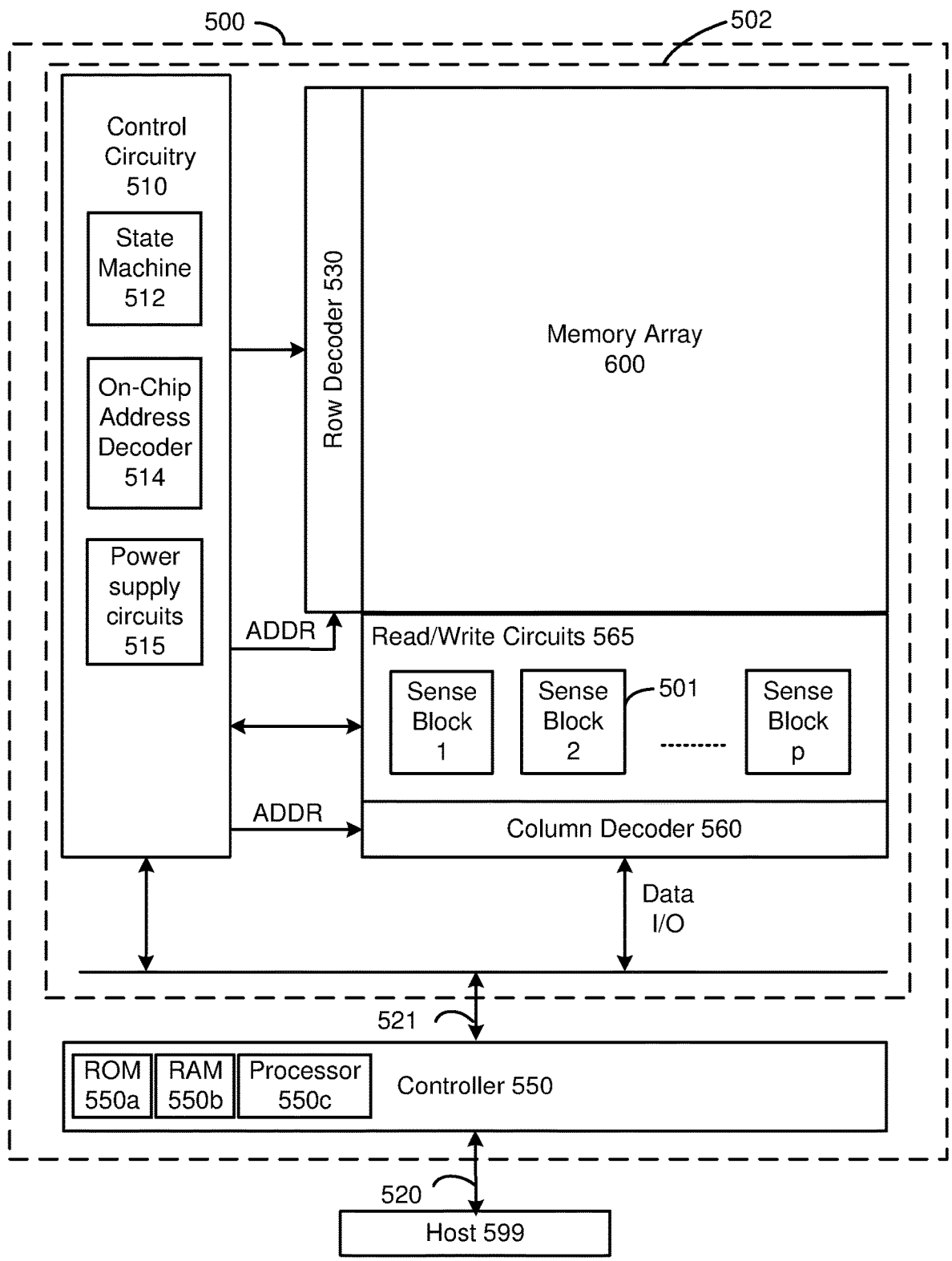
FIG. 5 is a block diagram of an example memory system which can be part of the IC package 100 of FIG. 1A.

FIG. 5 is a block diagram of an example memory system which can be part of the IC package 100 of FIG. 1A. The memory system may include many blocks of storage elements. See, e.g., FIG. 6. The memory system 500 has read/write circuits for reading and programming a page of storage elements in parallel, and may include one or more memory die 502. Memory die 502 includes an array 600 of storage elements, which may include several of the blocks 601 of FIG. 6, control circuitry 510, and read/write circuits 565. In some embodiments, the array of storage elements can be three dimensional. The memory array is addressable by word lines via a row decoder 530 and by bit lines via a column decoder 560. The read/write circuits 565 include multiple sense blocks 501 and allow a page of storage elements to be read or programmed in parallel. Typically an off-chip controller 550 is included in the same memory device (e.g., a removable storage card) as the one or more memory die 502. The controller 500 therefore can be on a die which is different than the die 502. The control circuitry 510 and the controller 550 can be on the same or different dies.

Commands and data are transferred between the host 599 and controller 550 via a bus 520 and between the controller and the one or more memory die 502 via a bus 521. One example of a bus is a Peripheral Component Interconnect Express (PCIe) bus.

In one option, the control circuitry 510 is on a die which is different than the die 502 which includes the memory array. It is also possible for other components outside the memory array 600 to be on a different die than the memory array. These components include the row decoder, column decoder, read/write circuits and sense blocks. One or more die can primarily comprise memory arrays while associated circuitry is on one or more other dies. This provides a modular approach.

The controller 550 may comprise an application-specific integrated circuit (ASIC), for example, which includes a processor such as a microprocessor 550c, and storage devices (memory) such as a ROM 550a and a RAM 550b. The RAM may be, but is not limited to, SRAM and DRAM. The storage devices comprise code such as a set of instructions, and the processor is configured to execute the set of instructions to provide a desired functionality. Alternatively or additionally, the processor can access code from a storage device region of the memory array 600, such as a reserved area of memory cells in one or more word lines.

The code is used by the controller 550 to access the memory array such as for programming, read and erase operations. The code can include boot code and control code. The boot code is software that initializes the controller 550 during a booting or startup process and enables the memory controller to access the memory array. When powered up, the processor 550c fetches the boot code from the ROM 550a or the storage device region of memory array for execution, and the boot code initializes the system components and loads the control code into the RAM 550b. Once the control code is loaded into the RAM 550b, it is executed by the processor 550c. The control code includes drivers to perform basic tasks such as controlling and allocating memory, prioritizing the processing of instructions, and controlling input and output ports.

The controller 550 controls communication between the memory die 502 and a host device 599. The host device may, for example, be a printed circuit board to which the die 502 and/or controller 550 are mounted. The host device may alternatively be a computing system.

The control circuitry 510 cooperates with the read/write circuits 565 to perform operations on the memory array. The control circuitry 510 includes a state machine 512, an on-chip address decoder 514 and power supply circuits 515 such as charge pumps.

The state machine 512 provides chip-level control of memory operations. The state machine may be configured to perform operations on the memory cells such as read and verify processes. The on-chip address decoder 514 provides an address (ADDR) interface between that used by the host or a memory controller to the hardware address used by the decoders 530 and 560. The power supply circuits 515 control the power and voltages supplied to the word lines and bit lines during memory operations.

In some implementations, some of the components of FIG. 5 can be combined. In various designs, one or more of the components (alone or in combination), other than memory array 600, can be thought of as a managing or control circuit. For example, one or more managing or control circuits may include any one of, or a combination of, control circuitry 510, state machine 512, decoders 514 and 560, power supply circuits 515, sense blocks 501, read/write circuits 565, controller 550, host 599, and so forth.

The data stored in the memory array is read out by the column decoder 560 and output to external I/O lines via the data I/O line and a data input/output buffer. Program data to be stored in the memory array is input to the data input/output buffer via the external I/O lines. Command data for controlling the memory device are input to the controller 550. The command data informs the flash memory of what operation is requested. The input command is transferred to the control circuitry 510. The state machine 512 can output a status of the memory device such as READY/BUSY or PASS/FAIL. When the memory device is busy, it cannot receive new read or write commands.

Figure 6:
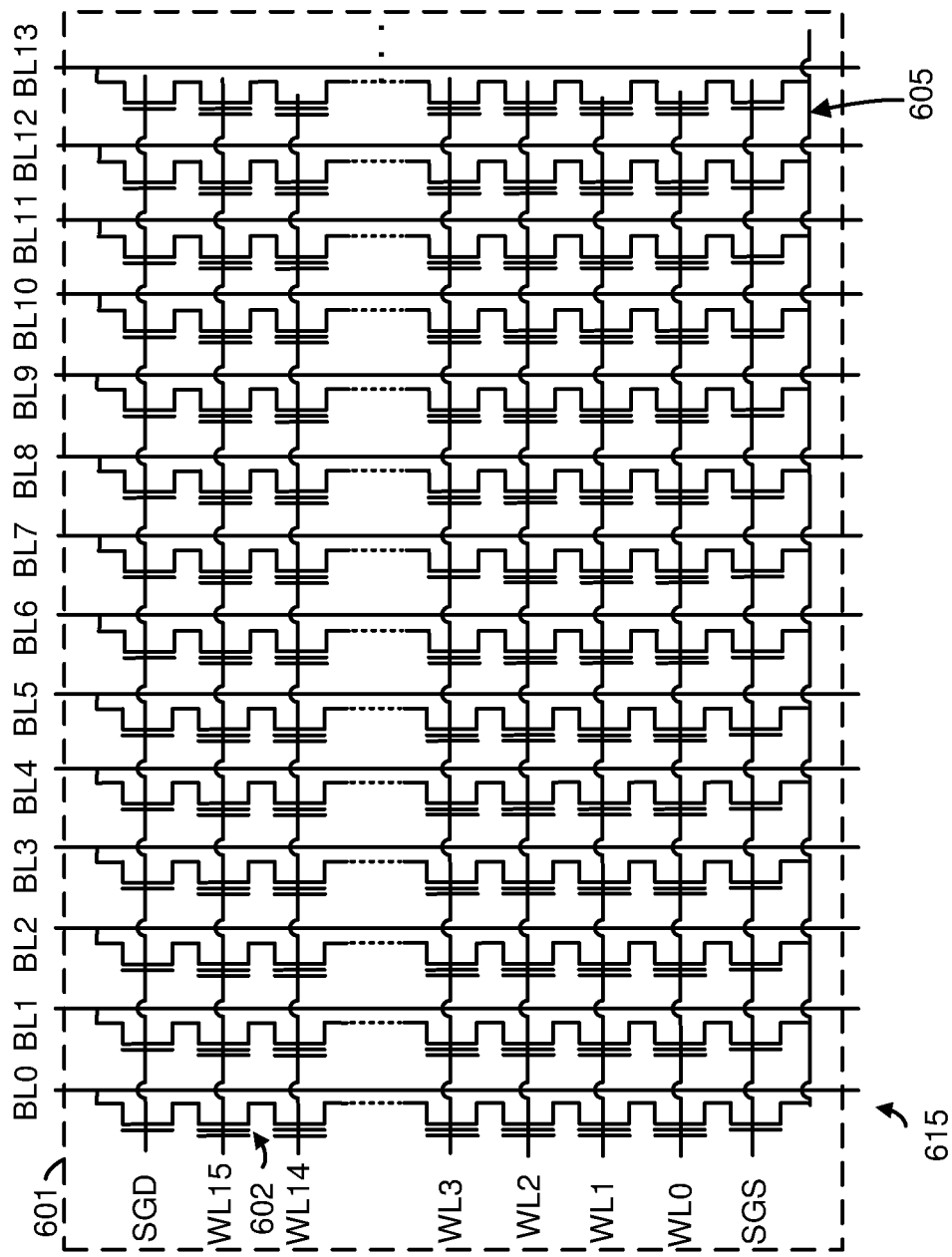
FIG. 6 depicts a block of memory cells in an example configuration of the memory array 500 of FIG. 5.

FIG. 6 depicts a block of memory cells in an example configuration of the memory array 600 of FIG. 5. The memory cells may represent a plurality of non-volatile memory cells. In one example application, the power supply circuits 515 is used to provide voltages to the memory cells at different levels during erase, program or read operations in a non-volatile memory device such as a NAND flash EEPROM. In such a device, a block 601 of memory cells includes a number of storage elements which communicate with respective word lines WL0-WL15, respective bit lines BL0-BL13, and a common source line 605. An example storage element 602 is depicted. In the example provided, sixteen storage elements are connected in series to form a NAND string (see example NAND string 615), and there are sixteen data word lines WL0 through WL15. Moreover, one terminal of each NAND string is connected to a corresponding bit line via a drain select gate (connected to select gate drain line SGD), and another terminal is connected to a common source 605 via a source select gate (connected to select gate source line SGS). Thus, the common source 605 is coupled to each NAND string. The block 601 is typically one of many such blocks in a memory array.

In an erase operation, a high voltage such as 20 V is applied to a substrate on which the NAND string is formed to remove charge from the storage elements. During a programming operation, a voltage in the range of 15-25 V is applied to a selected word line. In one approach, step-wise increasing program pulses are applied until a storage element is verified to have reached an intended state. Moreover, pass voltages at a lower level may be applied concurrently to the unselected word lines. In read and verify operations, the select gates (SGD and SGS) are connected to a voltage in a range of 2.5 to 4.5 V and the unselected word lines are raised to a read pass voltage, Vread, (typically a voltage in the range of 4.5 to 6 V) to make the transistors operate as pass gates. The selected word line is connected to a voltage, a level of which is specified for each read and verify operation, to determine whether a Vth of the concerned storage element is above or below such level.

Accordingly, in one embodiment, an apparatus comprises: a mirror circuit comprising an input path and an output path, the input path comprising a first path in parallel with a second path, the first path comprising a first transistor in series with a second transistor, the second path comprising a third transistor in series with a fourth transistor, wherein a first node between the first transistor and the second transistor is configured to connect to a first pin of an integrated circuit package, and a second node between the third transistor and the fourth transistor is configured to connect to a second pin of the integrated circuit package; a comparator connected to the output path and to a reference voltage; and a control circuit connected to the first, second, third and fourth transistors and to the comparator. The control circuit is configured to detect a short circuit between the first pin and the second pin.

In another embodiment, a method comprises: connecting a first pin of an integrated circuit package to an input path of a current mirror; connecting a second pin of the integrated circuit package to the input path of the current mirror, the input path comprising a first path in parallel with a second path, the first pin is connected to the first path and the second pin is connected to the second path; and detecting a short circuit between the first pin and the second pin, the detecting comprising monitoring a voltage at an output path of the current mirror while configuring the first path and the second path.

In another embodiment, an apparatus comprises: a memory die comprising a plurality of non-volatile memory cells; a current mirror on the memory die, the current mirror comprising an input path and an output path, the input path comprising a first path in parallel with a second path, the first path is configured to connect to a first pin of an integrated circuit package and the second path is configured to connect to a second pin of the integrated circuit package; and a control circuit. The control circuit is configured to detect a short circuit between the first pin and the second pin by monitoring a voltage of the output path.

The foregoing detailed description of the invention has been presented for purposes of illustration and description. It is not intended to be exhaustive or to limit the invention to the precise form disclosed. Many modifications and variations are possible in light of the above teaching. The described embodiments were chosen to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus, comprising:
a mirror circuit comprising an input path and an output path, the input path comprising a first path in parallel with a second path, the first path comprising a first transistor in series with a second transistor, the second path comprising a third transistor in series with a fourth transistor, wherein a first node between the first transistor and the second transistor is configured to connect to a first pin of an integrated circuit package, and a second node between the third transistor and the fourth transistor is configured to connect to a second pin of the integrated circuit package;
a comparator connected to the output path and to a reference voltage; and
a control circuit connected to the first, second, third and fourth transistors and to the comparator, the control circuit configured to detect a short circuit between the first pin and the second pin.

2. The apparatus of claim 1, wherein:
to detect a resistive short circuit between the first pin and the second pin, the control circuit is configured to turn on the first and fourth transistors while the second and third transistors are off, and to determine whether the comparator indicates a voltage at the output path exceeds the reference voltage.

3. The apparatus of claim 1, wherein:
to detect a resistive short circuit between the first pin and the second pin, the control circuit is configured to turn on the second and third transistors while the first and fourth transistors are off, and to determine whether the comparator indicates a voltage at the output path exceeds the reference voltage.

4. The apparatus of claim 1, wherein:
to detect a diode short circuit in a direction from the first pin to the second pin, the control circuit is configured to obtain a first output of the comparator while the first and fourth transistors are turned on and the second and third transistors are turned off, to obtain a second output of the comparator while the second and third transistors are turned on and the first and fourth transistors are turned off, and determine whether the first output exceeds the second output.

5. The apparatus of claim 1, wherein:
to detect a diode short circuit in a direction from the second pin to the first pin, the control circuit is configured to obtain a first output of the comparator while the second and third transistors are turned on and the first and fourth transistors are turned off, to obtain a second output of the comparator while the first and fourth transistors are turned on and the second and third transistors are turned off, and determine whether the first output exceeds the second output.

6. The apparatus of claim 1, wherein:
to detect a capacitive short circuit between the first pin and the second pin, the control circuit is configured to determine whether a voltage pulse is output by the comparator when the first and fourth transistors are turned on while the second and third transistors are turned off.

7. The apparatus of claim 1, wherein:
to detect a short circuit between the first pin and ground, the control circuit is configured to evaluate an output of the comparator when the first transistor is turned on and the second and third transistors are turned off.

8. The apparatus of claim 7, wherein:
the control circuit is configured to adjust the reference voltage to determine a strength of the short circuit between the first pin and ground.

9. The apparatus of claim 1, further comprising:
a multiplexer, wherein the integrated circuit package comprises a plurality of pins, greater than two pins, and the multiplexer is configured to connect the first pin to the first node and to connect the second pin to the second node.

10. The apparatus of claim 1, wherein the control circuit is configured to:
obtain a first output of the comparator while the first and second transistors are turned on and the third transistor is turned off;
obtain a second output of the comparator while the third and fourth transistors are turned on and the first transistor is turned off; and
determine that there is a short circuit between the first pin and a power supply when the first output is less than the second output.

11. The apparatus of claim 10, wherein the control circuit is configured to:
determine that there is a short circuit between the second pin and the power supply when the second output is less than the first output.

12. The apparatus of claim 1, wherein:
the first and third transistors are connected to a power supply; and
the second transistor is connected between the first transistor and ground; and
the fourth transistor is connected between the third transistor and ground.

13. A method, comprising:
connecting a first pin of an integrated circuit package to an input path of a current mirror;
connecting a second pin of the integrated circuit package to the input path of the current mirror, the input path comprising a first path in parallel with a second path, the first pin is connected to the first path and the second pin is connected to the second path; and
detecting a short circuit between the first pin and the second pin, the detecting comprising monitoring a voltage at an output path of the current mirror while grounding the second path without grounding the first path.

14. The method of claim 13, wherein:
the grounding the second path without grounding the first path enables a current to flow from the first pin to ground via the second pin if the short circuit exists between the first pin and the second pin.

15. The method of claim 13, further comprising:
monitoring a voltage at the output path while the first pin is connected to a power supply via the first path, and the first path and the second path are not grounded, to detect a short circuit between the first pin and ground.

16. The method of claim 13, further comprising:
monitoring a first output of the output path while the first path is grounded and the second path is not grounded;
monitoring a second output of the output path while the first path is not grounded and the second path is grounded; and
determine whether the first pin is short circuited to a power supply based on whether the first output is less than the second output.

17. The method of claim 13, wherein the short circuit is a diode short circuit between the first pin and the second pin, the method further comprising:
determining a direction of the diode short circuit.

18. An apparatus, comprising:
a memory die comprising a plurality of non-volatile memory cells;
a current mirror, the current mirror comprising an input path and an output path, the input path comprising a first path in parallel with a second path, the first path is configured to connect to a first pin of an integrated circuit package and the second path is configured to connect to a second pin of the integrated circuit package; and
a control circuit, the control circuit is configured to detect a short circuit between the first pin and the second pin by monitoring a voltage of the output path while grounding the second path without grounding the first path.

19. The apparatus of claim 18, wherein:
the control circuit is configured to detect a short circuit between the first pin and ground by monitoring the voltage of the output path.

20. The apparatus of claim 18, wherein:
the control circuit is configured to detect a short circuit between the first pin and a power supply by monitoring the voltage of the output path when the first path is grounded and separately monitoring the voltage of the output path when the second path is grounded.

* * * * *